United States Patent
Kubo et al.

(10) Patent No.: US 9,647,466 B2
(45) Date of Patent: May 9, 2017

(54) BATTERY SYSTEM IN WHICH INFORMATION TRANSMISSION OCCURS VIA INSULATING CIRCUITS

(75) Inventors: Kenji Kubo, Hitachi (JP); Akihiko Kudo, Hitachinaka (JP); Mutsumi Kikuchi, Mito (JP); Gosuke Shibahara, Hitachinaka (JP)

(73) Assignees: Hitachi, Ltd., Tokyo (JP); Hitachi Automotive Systems, Ltd., Hitachinaka-shi (JP)

(*) Notice: Subject to any disclaimer, the term of this patent is extended or adjusted under 35 U.S.C. 154(b) by 2243 days.

(21) Appl. No.: 12/495,038

(22) Filed: Jun. 30, 2009

(65) Prior Publication Data

US 2010/0001737 A1    Jan. 7, 2010

(30) Foreign Application Priority Data

Jul. 1, 2008   (JP) ................. 2008-172477

(51) Int. Cl.
*H02J 7/00*        (2006.01)
*G01N 27/416*    (2006.01)
(Continued)

(52) U.S. Cl.
CPC ............ *H02J 7/0013* (2013.01); *B60L 11/18* (2013.01); *B60L 2200/26* (2013.01); *H01M 6/42* (2013.01);
(Continued)

(58) Field of Classification Search
CPC .................................................. H02J 7/0013
(Continued)

(56) References Cited

U.S. PATENT DOCUMENTS

| 6,172,485 | B1 | 1/2001 | Fujita et al. |
| 7,511,457 | B2* | 3/2009 | Emori et al. ............. 320/118 |

(Continued)

FOREIGN PATENT DOCUMENTS

| EP | 1 289 096 A2 | 3/2003 |
| EP | 1 806 592 A1 | 7/2007 |

(Continued)

OTHER PUBLICATIONS

Japanese Office Action dated Aug. 19, 2014, including English translation (eight (8) pages).

(Continued)

*Primary Examiner* — Richard V Muralidar
(74) *Attorney, Agent, or Firm* — Crowell & Moring LLP

(57) ABSTRACT

A battery system includes a battery module that is constituted with a plurality of serially connected battery cells, a plurality of integrated circuits that group the battery cells so as to perform processing on battery cells in each group, a first transmission path through which a command signal is transmitted via a first insulating circuit from a higher-order control circuit that controls the integrated circuits to a highest-order integrated circuit of the integrated circuit, a second transmission path through which a data signal collected by the integrated circuits is transmitted from the highest-order integrated circuit to a lowest-order integrated circuit, and a third transmission path through which the data signal is transmitted from the lowest-order integrated circuit to the higher-order control circuit via a second insulating circuit.

3 Claims, 20 Drawing Sheets

(51) Int. Cl.
*B60L 11/18* (2006.01)
*H01M 6/42* (2006.01)

(52) U.S. Cl.
CPC ......... *H02J 7/0016* (2013.01); *H02J 7/0021* (2013.01); *Y02T 10/7005* (2013.01); *Y02T 10/7011* (2013.01); *Y02T 10/7055* (2013.01)

(58) Field of Classification Search
USPC .................. 320/119–123; 324/433, 434
See application file for complete search history.

(56) References Cited

U.S. PATENT DOCUMENTS

| | | | |
|---|---|---|---|
| 7,593,199 | B2 | 9/2009 | Yun et al. |
| 7,830,122 | B2 | 11/2010 | Yun et al. |
| 8,111,071 | B2 * | 2/2012 | Lim et al. .................. 324/434 |
| 2005/0242667 | A1 | 11/2005 | Emori et al. |
| 2006/0007622 | A1 | 1/2006 | Furukawa et al. |
| 2007/0052462 | A1 | 3/2007 | Yun et al. |
| 2007/0285083 | A1 | 12/2007 | Kamata |
| 2008/0050645 | A1 | 2/2008 | Kai et al. |
| 2010/0001694 | A1 | 1/2010 | Yun et al. |

FOREIGN PATENT DOCUMENTS

| | | | |
|---|---|---|---|
| JP | 10-215524 A | | 8/1998 |
| JP | 2003-70171 A | | 3/2003 |
| JP | 2003-70179 A | | 3/2003 |
| JP | 2003-070179 | * | 7/2003 |
| JP | 2006-25501 A | | 1/2006 |
| JP | 2006-296034 A | | 10/2006 |
| JP | 2007-74895 A | | 3/2007 |
| JP | 2007-278913 A | | 10/2007 |
| JP | 2008-35671 A | | 2/2008 |
| WO | WO 2008/055505 A1 | | 5/2008 |

OTHER PUBLICATIONS

Extended European Search Report dated Apr. 8, 2016 in corresponding European Application No. 09164178.7 (10 pages).

* cited by examiner

BATTERY SYSTEM IN WHICH INFORMATION TRANSMISSION OCCURS VIA INSULATING CIRCUITS

INCORPORATION BY REFERENCE

The disclosure of the following priority application is herein incorporated by reference:

Japanese Patent Application No. 2008-172477 filed Jul. 1, 2008

BACKGROUND OF THE INVENTION

1. Field of the Invention

The present invention relates to a vehicle battery system used for a vehicle having an electric drive such as an electric vehicle, a hybrid vehicle, and an electric train, or a general industrial power supply system. In addition, the present invention relates to a circuit board and an integrated circuit for these systems.

2. Description of Related Art

As Japanese Laid Open Patent Publication No. 2003-70179 discloses, a conventional battery system includes a battery module constituted by connecting a plurality of battery groups which are constituted by serially connecting a plurality of battery cells, and subordinate control devices that individually monitor the state of the battery cells for each of the battery groups. These subordinate control devices each receive a command from a higher-order control device through a signal transmission path. The signal transmission path is provided with an insulating circuit such as a photocoupler in order not to be influenced by a potential difference between the subordinate control device and the superior control device.

Since a vehicle body of an automobile, an electric train, or the like is easily contacted by a human body, it is necessary to improve safety. Therefore, a conventional battery system as described above mounted on a vehicle assumes a structure in which the battery system is electrically insulated from the vehicle body. The same is true for an industrial machine, i.e., the machine itself or the housing of the industrial machine is also easily contacted by a human body. Therefore, an electric power system of a conventional battery system as described above used for an industrial purpose is electrically insulated from the machine itself or the housing of the industrial machine so as to improve safety for a human body. On the other hand, since another electric power system with low source voltage such as a power source for control circuit does not negatively affect on a human body, a vehicle body or a housing may be used as a reference potential. In other words, a vehicle body or a housing may be used as a part of a low electric power system. In particular, a vehicle body is used as a part of a low electric power system for an automobile.

As described above, a conventional battery system is insulated from another electric power system so as to increase safety. In addition, in view of overhaul and repair of the system or the case of traffic accident, it is preferable for a battery system to be connected in series via an openable and closable connector. This structure opens the connector so as to cut off a DC supply current from the battery system, thereby improving safety.

A battery system with the structure as described above includes a plurality of serially connected battery cells that are further connected in series via the connector. In addition, the battery system with the structure as described above includes a plurality of integrated circuits that serve as battery cell controllers for measurement of terminal voltage at each battery cell, diagnosis for each battery cell, control of the state of charge of each battery cell, and the like (these functions are hereinafter collectively called battery cell processing). The plurality of integrated circuits that process the plurality of battery cells each include transmission circuits. The transmission circuits that each of the integrated circuits includes are also serially connected to each other, so that the serially connected transmission circuits form transmission paths.

The integrated circuits explained above are each electrically connected to the battery cells which are connected in series, and influenced by potentials of the connected battery cells. It is difficult to increase withstand voltage in these integrated circuits. If a high voltage is applied to the integrated circuits for some reasons, it exceeds the withstand voltage of the integrated circuits and they may be damaged. For example, when the connector that is serially connected to the battery cells is opened, the battery cells at the both ends of the connector are insulated from each other and therefore the potential state of the battery cells changes and a voltage exceeding the withstand voltage may be applied to some of the integrated circuits. Consequently, a highly reliable battery system that is less subject to change of the potential state of the battery cells caused by open/close of the connector is desired.

SUMMARY OF THE INVENTION

The present invention intends to provide a highly reliable battery system.

A battery system according to a first aspect of the present invention comprises: a first battery module that is constituted with a plurality of serially connected first battery cell groups each constituted with a plurality of serially connected battery cells; a second battery module that is constituted with a plurality of serially connected second battery cell groups each constituted with a plurality of serially connected battery cells; one power supply line that is connected to one end of the first battery module; another power supply line that is connected to the other end of the second battery module; a connector that is provided between the first and second battery modules so as to removably connect the other end of the first battery module and the one end of the second battery module in series; a plurality of first integrated circuits that are provided corresponding to each of the first battery cell groups so as to perform processing on each of the first battery cell groups constituting the first battery module; and a plurality of second integrated circuits that are provided corresponding to each of the second battery cell groups so as to perform processing on each of the second battery cell groups constituting the second battery module. In this battery system, the first and second integrated circuits each include transmission terminals for outputting information and reception terminals for receiving information; transmission terminals of the first integrated circuits are respectively connected to reception terminals of adjacent first integrated circuits so as to form a serially connected first transmission path; and transmission terminals of the second integrated circuits are respectively connected to reception terminals of adjacent second integrated circuits so as to form a serially connected second transmission path. This battery system further comprises: a first insulating circuit for performing information transmission between the reception terminal or the transmission terminal of the first integrated circuit provided corresponding to the first battery cell group at the other end of the first battery module and another control circuit; and a second insulating circuit for performing information transmission between the reception terminal or the transmission terminal of the second integrated circuit provided corresponding to the second battery cell group at one end of the second battery module and another control circuit.

A battery system according to a second aspect of the present invention comprises: a first battery module that is constituted with a plurality of serially connected first battery cell groups each constituted with a plurality of serially connected battery cells; a second battery module that is constituted with a plurality of serially connected second battery cell groups each constituted with a plurality of serially connected battery cells; one power supply line that is connected to one end of the first battery module; another power supply line that is connected to the other end of the second battery module; a connector that is provided between the first and second battery modules so as to removably connect the other end of the first battery module and the one end of the second battery module in series; a plurality of first integrated circuits that are provided corresponding to each of the first battery cell groups so as to perform processing on each of the first battery cell groups constituting the first battery module; a plurality of detection lines that are provided for respectively inputting each terminal voltage at a plurality of battery cells constituting each first battery cell group to each of the first integrated circuits that has been provided correspondingly; a plurality of second integrated circuits that are provided corresponding to each of the second battery cell groups so as to perform processing on each of the second battery cell groups constituting the second battery module; and a plurality of detection lines that are provided for respectively inputting each terminal voltage at a plurality of battery cells constituting each second battery cell group to each of the second integrated circuits that has been provided correspondingly. In this battery system, the first and second integrated circuits each include transmission terminals for outputting information and reception terminals for receiving information; transmission terminals of the first integrated circuits are respectively connected to reception terminals of adjacent first integrated circuits so as to form a serially connected first transmission path; and transmission terminals of the second integrated circuits are respectively connected to reception terminals of adjacent second integrated circuits so as to form a serially connected second transmission path. This battery system further comprises: a first insulating circuit for performing information transmission between the reception terminal or the transmission terminal of the first integrated circuit provided corresponding to the first battery cell group at the one end of the first battery module and another control circuit; a second insulating circuit for performing information transmission between the reception terminal or the transmission terminal of the first integrated circuit provided corresponding to the first battery cell group at the other end of the first battery module and another control circuit; a third insulating circuit for performing information transmission between the reception terminal or the transmission terminal of the second integrated circuit provided corresponding to the second battery cell group at the one end of the second battery module and another control circuit; and a fourth insulating circuit for performing information transmission between the reception terminal or the transmission terminal of the second integrated circuit provided corresponding to the second battery cell group at the other end of the second battery module and another control circuit.

A battery system according to a third aspect of the present invention comprises: a first lithium ion battery module that is constituted with a plurality of serially connected first lithium ion battery cell groups constituted with a plurality of serially connected lithium ion battery cells; a second lithium ion battery module that is constituted with a plurality of serially connected second lithium ion battery cell groups constituted with a plurality of serially connected lithium ion battery cells; a connector that removably connects the first lithium ion battery module with the second lithium ion battery module in series; one power supply line that is connected to one end of the first lithium ion battery module; another power supply line that is connected to the other end of the second lithium ion battery module; a plurality of first integrated circuits that are provided corresponding to each first lithium ion battery cell group constituting the first lithium ion battery module so as to perform processing on lithium ion battery cells of corresponding first lithium ion battery cell group; and a plurality of second integrated circuits that are provided corresponding to each second lithium ion battery cell group constituting the second lithium ion battery module so as to perform processing on lithium ion battery cells of corresponding second lithium ion battery cell group. In this battery system, the first and second integrated circuits each include transmission terminals for transmitting signals and reception terminals for receiving signals, and each further include a plurality of voltage detection terminals for receiving terminal voltage at each lithium ion battery cell constituting a corresponding lithium ion battery cell group; a first transmission path is formed by electrically connecting transmission terminals of the plurality of first integrated circuits and reception terminals of adjacent first integrated circuits respectively, a second transmission path is formed by electrically connecting transmission terminals of the plurality of second integrated circuits and reception terminals of adjacent second integrated circuits respectively; and an insulating circuit is provided for performing information transmission between the reception terminal or the transmission terminal of the first integrated circuit provided corresponding to the first lithium ion battery cell group at the other end of the first lithium ion battery module and the reception terminal or the transmission terminal of the second integrated circuit provided corresponding to the second lithium ion battery cell group at the one end of the second lithium ion battery module, so as to perform information transmission between the first transmission path and the second transmission path via the insulating circuit.

A battery system according to a fourth aspect of the present invention comprises: a first lithium ion battery module that is constituted with a plurality of serially connected first lithium ion battery cell groups constituted with a plurality of serially connected lithium ion battery cells; a second lithium ion battery module that is constituted with a plurality of serially connected second lithium ion battery cell groups constituted with a plurality of serially connected lithium ion battery cells; one power supply line that is connected to one end of the first lithium ion battery module; another power supply line that is connected to the other end of the second lithium ion battery module; a connector that removably connects the first lithium ion battery module with the second lithium ion battery module in series; a plurality of first integrated circuits that are provided corresponding to each first lithium ion battery cell group constituting the first lithium ion battery module so as to perform processing on lithium ion battery cells of corresponding first lithium ion battery cell group; a plurality of second integrated circuits that are provided corresponding to each second lithium ion battery cell group constituting the second lithium ion battery module so as to perform processing on lithium ion battery cells of corresponding second lithium ion battery cell group; and a control circuit that controls the plurality of first and second integrated circuits. In this battery system, a series circuit is formed by electrically connecting the one power supply line, the first lithium ion battery module, the connector, the second lithium ion battery module, and the other power supply line; the control circuit, including transmission terminals for transmitting information and reception terminals for receiving information, operates based upon a power source electrically insulated from the series circuit; each of the first and second integrated circuits includes transmission terminals for transmitting information, reception terminals for receiving information, and voltage detection terminals for receiving terminal voltage at each lithium ion battery cell constituting a corresponding lithium ion battery cell group, includes an analog/digital converter circuit therein, and converts terminal voltage at each lithium ion battery cell that has been input to the voltage detection terminal into a digital value and holds the same; a first transmission path is formed by electrically connecting transmission terminals of the plurality of first integrated circuits and reception terminals of adjacent first integrated circuits; a second transmission path is formed by electrically connecting transmission terminals of the plurality of second integrated circuits and reception terminals of adjacent second integrated circuits; a first insulating circuit is provided for performing information transmission between the transmission terminals of the control circuit and the reception terminals of the first integrated circuit provided corresponding to the first lithium ion battery cell group at the one end of the first lithium ion battery module, so as to perform information transmission between the control circuit and the first transmission path via the first insulating circuit; a second insulating circuit is provided for performing information transmission between the transmission terminals of the first integrated circuit provided corresponding to the first lithium ion battery cell group at the other end of the first lithium ion battery module and the reception terminals of the second integrated circuit provided corresponding to the second lithium ion battery cell group at the one end of the second lithium ion battery module, so as to perform information transmission between the first transmission path and the second transmission path via the second insulating circuit; and a third insulating circuit is provided for performing information transmission between the transmission terminals of the second integrated circuit provided corresponding to the second lithium ion battery cell group at the other end of the second lithium ion battery module and the reception terminals of the control circuit, so as to perform information transmission between the second transmission path and the control circuit via the third insulating circuit.

A battery system according to a fifth aspect of the present invention comprises: a first battery module that is constituted with a plurality of serially connected battery cells; a second battery module that is constituted with a plurality of serially connected battery cells; a connector that removably connects the first battery module with the second battery module in series; a plurality of first integrated circuits that group battery cells of the first battery module by a plurality thereof so as to perform processing on battery cells in each group; a plurality of second integrated circuits that group battery cells of the second battery module by a plurality thereof so as to perform processing on battery cells in each group; a first transmission path through which a command signal is transmitted via a first insulating circuit from a higher-order control circuit that controls the plurality of first and second integrated circuits to a highest-order first integrated circuit of the plurality of first integrated circuits; a second transmission path through which a data signal collected by the plurality of first integrated circuits is transmitted from the highest-order first integrated circuit to a lowest-order first integrated circuit; a third transmission path through which the data signal collected by the plurality of first integrated circuits is transmitted from the lowest-order first integrated circuit to the higher-order control circuit via a second insulating circuit that is driven with electric power by a total voltage at the first battery module; a fourth transmission path through which a command signal is transmitted via a third insulating circuit from the higher-order control circuit to a highest-order second integrated circuit of the plurality of second integrated circuits; a fifth transmission path through which a data signal collected by the plurality of second integrated circuits is transmitted from the highest-order second integrated circuit to a lowest-order second integrated circuit; and a sixth transmission path through which the data signals collected by the plurality of first and second integrated circuits are transmitted from the lowest-order second integrated circuit to the higher-order control circuit via a fourth insulating circuit that is driven with electric power by a total voltage at the second battery module.

A battery system according to a sixth aspect of the present invention comprises: a first battery module that is constituted with a plurality of serially connected battery cells; a second battery module that is constituted with a plurality of serially connected battery cells; a connector that removably connects the first battery module with the second battery module in series; a plurality of first integrated circuits that group battery cells of the first battery module by a plurality thereof so as to perform processing on battery cells in each group; a plurality of second integrated circuits that group battery cells of the second battery module by a plurality thereof so as to perform processing on battery cells in each group; a first transmission path through which a command signal is transmitted via a first insulating circuit from a higher-order control circuit that controls the plurality of first and second integrated circuits to a highest-order first integrated circuit of the plurality of first integrated circuits; a second transmission path through which a data signal collected by the plurality of first integrated circuits is transmitted from the highest-order first integrated circuit to a lowest-order first integrated circuit; a third transmission path through which the data signal collected by the plurality of first integrated circuits is transmitted from the lowest-order first integrated circuit to a highest-order second integrated circuit of the plurality of second integrated circuits via a second insulating circuit; a fourth transmission path through which the data signal collected by the plurality of first integrated circuits and a data signal collected by the plurality of second integrated circuits are transmitted from the highest-order second integrated circuit to a lowest-order second integrated circuit; and a fifth transmission path through which the data signals collected by the plurality of first and second integrated circuits are transmitted from the lowest-order second integrated circuit to the higher-order control circuit via a third insulating circuit that is driven with electric power by a total voltage at the second battery module.

A battery system according to a seventh aspect of the present invention comprises: a battery module that is constituted with a plurality of serially connected battery cells; a plurality of integrated circuits that group the battery cells by a plurality thereof so as to perform processing on battery cells in each group; a first transmission path through which a command signal is transmitted via a first insulating circuit from a higher-order control circuit that controls the plurality of integrated circuits to a highest-order integrated circuit of the integrated circuit; a second transmission path through which a data signal collected by the plurality of integrated circuits is transmitted from the highest-order integrated circuit to a lowest-order integrated circuit; and a third transmission path through which the data signal collected by the plurality of integrated circuits is transmitted from the lowest-order integrated circuit to the higher-order control circuit via a second insulating circuit that is driven with electric power by a total voltage at the battery module.

According to an eighth aspect of the present invention, the battery system of the seventh aspect may further comprise a constant current circuit that uniforms the electric power by the total voltage at the battery module and supplies the uniformed electric power to the second insulating circuit.

According to a ninth aspect of the present invention, the battery system of the seventh or eighth aspect may further comprise a conduction control circuit that puts the first insulating circuit into a driving state in response to a startup signal that is output from the higher-order control circuit when the command signal is output and that puts the first insulating circuit into a non-driving state when the command signal is not output.

According to a tenth aspect of the present invention, in the battery system of the ninth aspect, it is preferred that the conduction control circuit includes a circuit hold function that holds the first insulating circuit in the driving state even if the startup signal has disappeared after the command signal is output and the highest-order integrated circuit is driven.

According to an eleventh aspect of the present invention, in the battery system of the ninth or tenth aspect, it is desirable that the integrated circuits each comprise: a constant voltage circuit that steps down a total voltage of the grouped battery cells to a predetermined voltage; and a signal generation circuit that uses a potential difference in the predetermined voltage to a ground level of each of the integrated circuits as a drive voltage so as to generate the data signal whose crest value is equal to or less than the drive voltage.

According to a twelfth aspect of the present invention, the battery system of the eleventh aspect may comprise: a startup circuit that starts up the constant voltage circuit by the startup signal; and a startup signal transmission circuit that transmits the startup signal from the highest-order integrated circuit to the lowest-order integrated circuit.

According to a thirteenth aspect of the present invention, in the battery system of the eleventh or twelfth aspect, it is preferred that the integrated circuit includes a first switching circuit that switches thresholds for level decision to a signal received via the transmission path, and, based upon a control signal provided from outside, switching of the first switching circuit is selected.

According to a fourteenth aspect of the present invention, in the battery system of any one of the seventh through thirteenth aspects, it is desirable that the integrated circuit includes a second switching circuit that switches whether to transmit the data signal with its waveform inverted or to transmit the data signal with its waveform non-inverted, and, based upon a control signal provided from outside, switching of the second switching circuit is selected.

According to a fifteenth aspect of the present invention, in the battery system of any one of the seventh through fourteenth aspects, it is preferable that the integrated circuit includes a control terminal to which a control signal that instructs a number of battery cells to be processed at the integrated circuit is four or six is input.

According to a sixteenth aspect of the present invention, in the battery system of any one of the seventh through fifteenth aspects, it is preferred that resistors are provided between terminals of the battery cells and terminal voltage input sections of the integrated circuits.

A battery system according to a seventeenth aspect of the present invention comprises: a plurality of integrated circuits that group battery cells of a battery module constituted with a plurality of serially connected battery cells into a plurality of groups, that perform processing on the battery cells in each group, and that are controlled by a higher-order control circuit; a first transmission path through which a command signal is transmitted from the higher-order control circuit to a highest-order integrated circuit of the plurality of integrated circuits; a second transmission path through which a data signal collected by the plurality of integrated circuits is transmitted from the highest-order integrated circuit to a lowest-order integrated circuit; a third transmission path through which the data signal collected by the plurality of integrated circuits is transmitted from the lowest-order integrated circuit to the higher-order control circuit; a first insulating circuit that is placed on the first transmission path and driven at a predetermined electric power; and a second insulating circuit that is placed on the third transmission path and driven with electric power by a total voltage at the battery module.

According to the present invention, reliability of a battery system can be improved. A great advantage can be achieved, for instance, when the present invention is applied to a lithium ion battery system. More specifically, an enormous advantage can be achieved when the present invention is applied to a lithium ion battery system for vehicles.

For a lithium ion battery system, it is desirable to constantly monitor the state of lithium ion battery cells with high accuracy based upon detection by a lithium ion battery cell controller. If a part of the lithium ion battery cell controller is damaged, accurate state detection of lithium ion battery cells, diagnosis based upon detection result, or information transmission may be difficult. In addition, the lithium ion battery cell controller may transmit an incorrect detection result or an incorrect judgment result that causes an erroneous operation. It is desirable to prevent these problems. Occurrence of the above-described problems may endanger human lives, particularly in a vehicle lithium ion battery system, therefore safety is desired to be improved. In addition, since a vehicle moves and subsequently has a possibility to encounter an accident, the accident may cause damage in the circuits. This results in a desire for high safety in a vehicle lithium ion battery system. Furthermore, since a vehicle lithium ion battery system is likely to be used in a variable environment for a long period of time, high safety is desired from this point of view as well.

DESCRIPTION OF PREFERRED EMBODIMENTS

Figure 1:
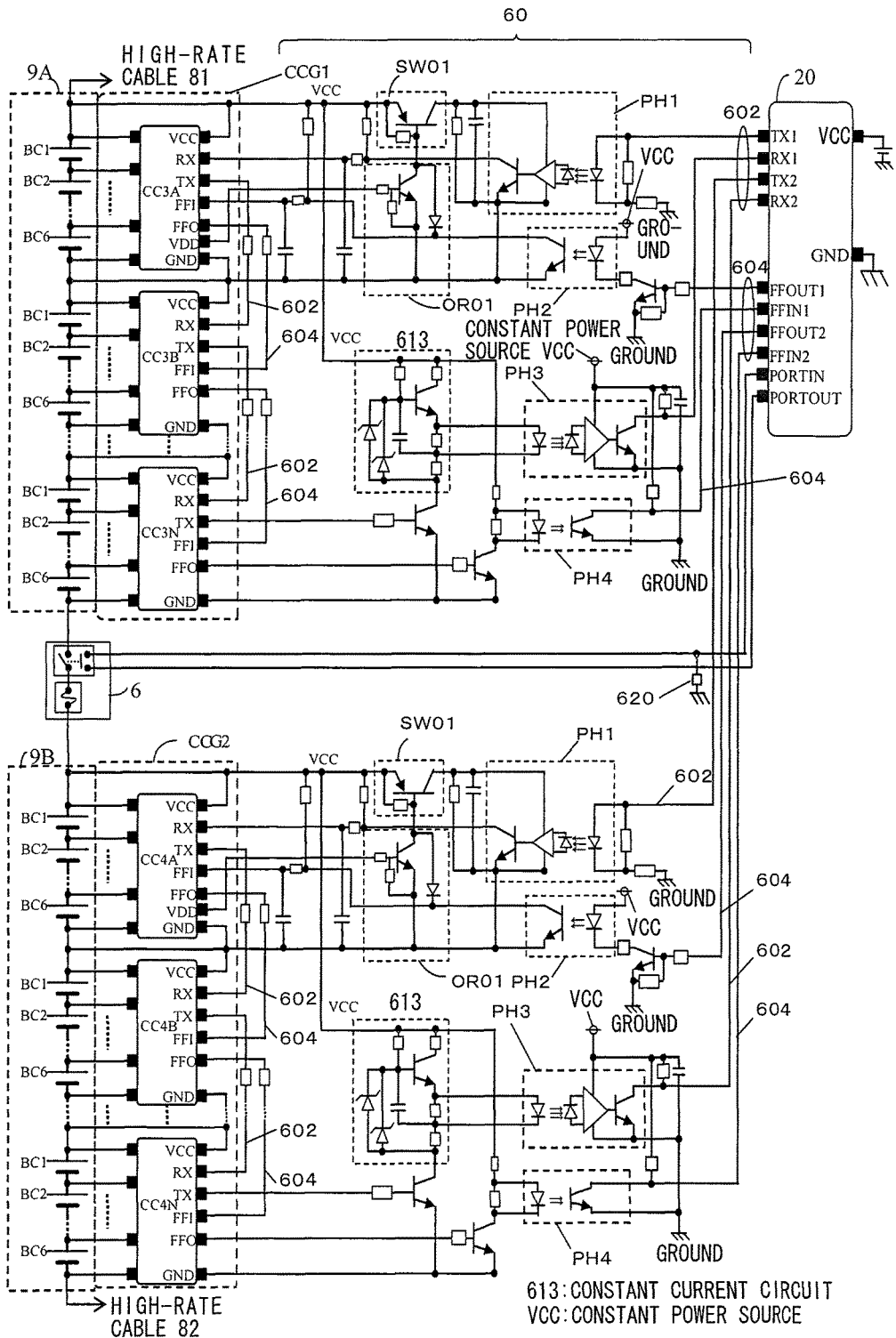
FIG. 1 is a diagram showing a vehicle battery system achieved in an embodiment.

Embodiments described below achieve improvements in various points desirable for manufacturing, i.e., not just improvement in reliability but also in other points. Representative points and their solutions will now be described.

[Uniformity with Regard to Power Consumption at Battery Cells]

An effort is made for the invention explained below so as to prevent the power consumption at serially connected lithium ion battery cells mounted on vehicle from becoming imbalanced. That is, uniformity is achieved with regard to the power consumption related to the lithium ion battery cells mounted on vehicle, in other words, electric power load of the lithium ion battery cells. Although descriptions below present a particularly effective example, in which the present invention is mounted on a vehicle, the present invention is not limited to be mounted on vehicles such as an electric train or an automobile. An advantageous effect can be achieved by applying it to an industrial battery system, in particular a lithium ion battery system.

Voltage of electric power generated by lithium ion battery cells mounted on vehicle is higher than that generated by another electric power system mounted on vehicle. They are electrically insulated from another electric power system mounted on vehicle in order to increase safety. Therefore, a plurality of integrated circuits to control the lithium ion battery cells are each electrically insulated from the above described other electric power system. Since a partner control circuit or another information transmission system in communication with the plurality of integrated circuits operates on another electric system, information transmission between the plurality of integrated circuits and the control circuit or another information transmission system is performed via an insulating circuit having electrically insulated input and output terminals. An insulating circuit is, for example, a circuit having a photocoupler. The insulating circuit converts an input signal which is input through an input terminal to light by a photodiode built in a photocoupler. In addition, the insulating circuit converts the light to an electric signal by a built-in phototransistor and outputs from an output terminal. Since information is transmitted in an insulating circuit by light as a medium, the input terminal and the output terminal are electrically insulated.

Electric power is required to operate the insulating circuit, in particular relatively high electric power is required to drive a photodiode. In addition, a photocoupler that transmits information at high speed consumes higher electric power than a photocoupler that transmits information at low speed does.

In the embodiments described below, information transmission terminals of integrated circuits that control lithium ion battery cells are electrically connected in series to each other, and information is transmitted via a transmission path constituted by the serial connection. Reception for information transmission with another transmission path or another control circuit is performed by the integrated circuit disposed at the front end (also referred to as the highest-order in embodiments described below) constituting the transmission path connected in series. On the other hand, transmission through a transmission path is performed by the integrated circuit disposed at the final end (also referred to as the lowest-order in embodiments described below) constituting a transmission path constituted by the serial connection. As mentioned above, information transmission via a photocoupler, which is an insulating circuit, requires relatively high electric power. Therefore, if electric power for the information transmission is assumed only by a lithium ion battery cell that supplies electric power to the integrated circuit at the final end, electric power load becomes imbalanced among a plurality of lithium ion battery cells. It is preferable to reduce the imbalance.

In the embodiments described below, electric power load is balanced in the following manner. A lithium ion battery module is constituted by a plurality of lithium ion battery cell groups connected in series, each of which are constituted by a plurality of lithium ion battery cells connected in series. In addition, the lithium ion battery module includes a plurality of integrated circuits provided corresponding to each of the lithium ion battery cell groups so as to perform processing related to each of the lithium ion battery cell groups. The integrated circuits each include a transmission terminal to output information therethrough and a reception terminal to receive information therethrough. The transmission terminals of the integrated circuits are connected to the reception terminals of the adjacent integrated circuits so as to form a transmission path constituted by serial connection. Power consumption at the insulating circuit from whose integrated circuit of the final end of the transmission path information is output is assumed not only by the lithium ion battery cell group corresponding to integrated circuit of the final end but also by a plurality of lithium ion battery cell groups. This prevents power consumption of the insulating circuits from being assumed unequally by any one of the lithium ion battery cell groups, thereby reducing imbalance of electric power load among the lithium ion battery cells. In the embodiments described below, in order to achieve greater effect, power consumption of the insulating circuit is assumed by electrical load of whole lithium ion battery cells between the lithium ion battery cell group corresponding to the integrated circuit at the front end constituting the transmission path and the lithium ion battery cell group corresponding to the integrated circuit at the final end constituting the transmission path. This configuration reduces imbalance of electric power load among the lithium ion battery cells. More specifically, as a power source of a drive circuit to drive a photodiode included in the insulating circuit, voltage is supplied for whole lithium ion battery cells between the lithium ion battery cell group corresponding to the integrated circuit at the front end constituting the transmission path and the lithium ion battery cell group corresponding to the integrated circuit at the final end constituting the transmission path.

[Reduction in Power Consumption at Lithium Ion Battery Cell]

[Reduction in Power Consumption 1]

It is desirable to save power consumption of the power source constituted by lithium ion battery cells connected in series as much as possible. In particular, for an automobile, it is desirable that a lithium ion battery power source as small as possible in size supplies electric power for traveling, so as to save power consumption as much as possible. Since an automobile often remains in a stationary state for a long period of time, it is particularly significant to keep power consumption during a stationary state low. In the embodiments described below, a circuit structure is assumed whereby drive current does not flow at insulating circuits used for an output from the transmission path constituted by serially connected transmission-reception terminals of the integrated circuits while the power source is not used, thereby saving power consumption. The transmission path uses a digital signal so as to perform information transmission, whereby it is preferable that the drive current does not flow in a state of digital value "0", i.e., no signal. In other words, it is preferable that the drive current flows in a state of digital value "1". The integrated circuits each include therein a circuit to select a relationship of "high" or "low" of voltage at transmission output terminals and "1" or "0" of the digital value. Selection of the relationship can be made in response to instruction signal provided from the outside. Selection of the relationship allows the drive current not to flow in a state where the digital value is "0". In the embodiments described below, for instance, when a power source constituted by lithium ion battery cells becomes unused because a vehicle becomes in a stationary state or the like, output of the transmission path becomes "0" and a drive current at a photodiode is automatically cut off. The circuit configuration described above results in saving power consumption.

[Reduction in Power Consumption 2]

In the embodiments described below, there are at least two types of transmission paths constituted by the integrated circuits. One is a first transmission path with higher power consumption at insulating circuits, through which terminal voltage at lithium ion battery cells measured in integrated circuits or an instruction are transmitted. The other is a second transmission path having a function to transmit a one-bit information, through which only a state is simply transmitted. The second transmission path has a transmission frequency lower than that the first transmission path has. Therefore, power consumption at insulating circuits of the second transmission path is lower than that of the first transmission path. In the present transmission system, when the transmission path is not used because the vehicle is in a stationary state or the like, power supply to the photocoupler of the first transmission path is stopped. Necessity of transmission due to startup the vehicle or the like causes the higher-order control circuit to transmit a signal indicating the state of "1" to the second transmission path. When the second transmission path receives the signal "1", power supply to the photocoupler of the first transmission path is started, transmission operation of the first transmission path can be started. Since power supply to the photocoupler of the first transmission path is automatically maintained during transmission operation of the first transmission path, power supply to the photocoupler of the first transmission path is maintained even if the second transmission path moves on to the operation of transmitting original information. This circuit configuration saves power consumption in a state where transmission is stopping.

[Reduction in Applied Voltage Upon Communication]

In the embodiments described below, integrated circuits, which are battery cell controllers, each use at least two types of power source voltages, i.e., a high power source voltage VCC and a low power source voltage VDD. A multiplexer, which selects terminal voltages at each of the lithium ion battery cells constituting the lithium ion battery cell group, operates upon the high power source voltage VCC, while an analog-digital converter, a variety of storage devices, or a transmission circuit for data transmission operate upon the low power source voltage VDD. In the embodiments described below, a transmission path is formed by serially connected transmission and reception circuits of each of the battery cell controllers. Potentials of the battery cell controllers are different from each other, and, in the order of the serial connection, potentials of the battery cell controllers rise or fall. In the transmission path constituted by serially connected circuits having potentials different from each other, when information is transmitted from a high potential side to a low potential side, a reception circuit operates upon the high power source voltage VCC and a transmission circuit operates upon the low power source voltage VDD, so that voltage between transmission-reception circuits of adjacent battery cell controllers, thereby improving reliability. On the other hand, when information is transmitted from a low potential side to a high potential side, a reception circuit or a transmission circuit operates upon the low power source voltage VDD, so that the potential difference among transmission-reception circuits can be reduced, thereby improving reliability. By operating circuits upon the low power source voltage VDD in both methods described above, power consumption can be saved.

[Quick Startup from a Sleep State]

In the embodiments described below, a transmission path is constituted by a plurality of transmission circuits of each of the integrated circuits, which are battery cell controllers, being connected in series, so as to reduce the number of necessary insulating circuits. In addition, in order to reduce power consumption, the battery cell controller is set into the sleep state. A vehicle requires the plurality of battery cell controllers connected in series to be set into enabled state in a short period of time. For this reason, in the embodiments described below, the battery cell controllers each include a startup output circuit that transmits a wake-up signal, the battery cell controllers each perform self-wake-up operation upon receiving the wake-up signal, and each simultaneously transmit a wake-up signal from the startup output circuit to the next battery cell controller regardless as to whether or not self-wake-up operation has been completed. This allows a wake-up signal to be transmitted to the next battery cell controller even before self-wake-up is completed, thereby enabling to quickly transmit a wake-up signal to each of the battery cell controllers connected in series. This results in quick wake-up of the whole system compared to transmitting a wake-up signal to the next battery cell controller after each of the battery cell controller has completed wake-up operation. In particular, through the embodiments described below applied to an automobile, quick wake-up of the whole system allows a driver to realize a quick operation of the system and a quick start of the automobile.

Other issues and their solutions will be described with reference to the drawings.

Figure 2:
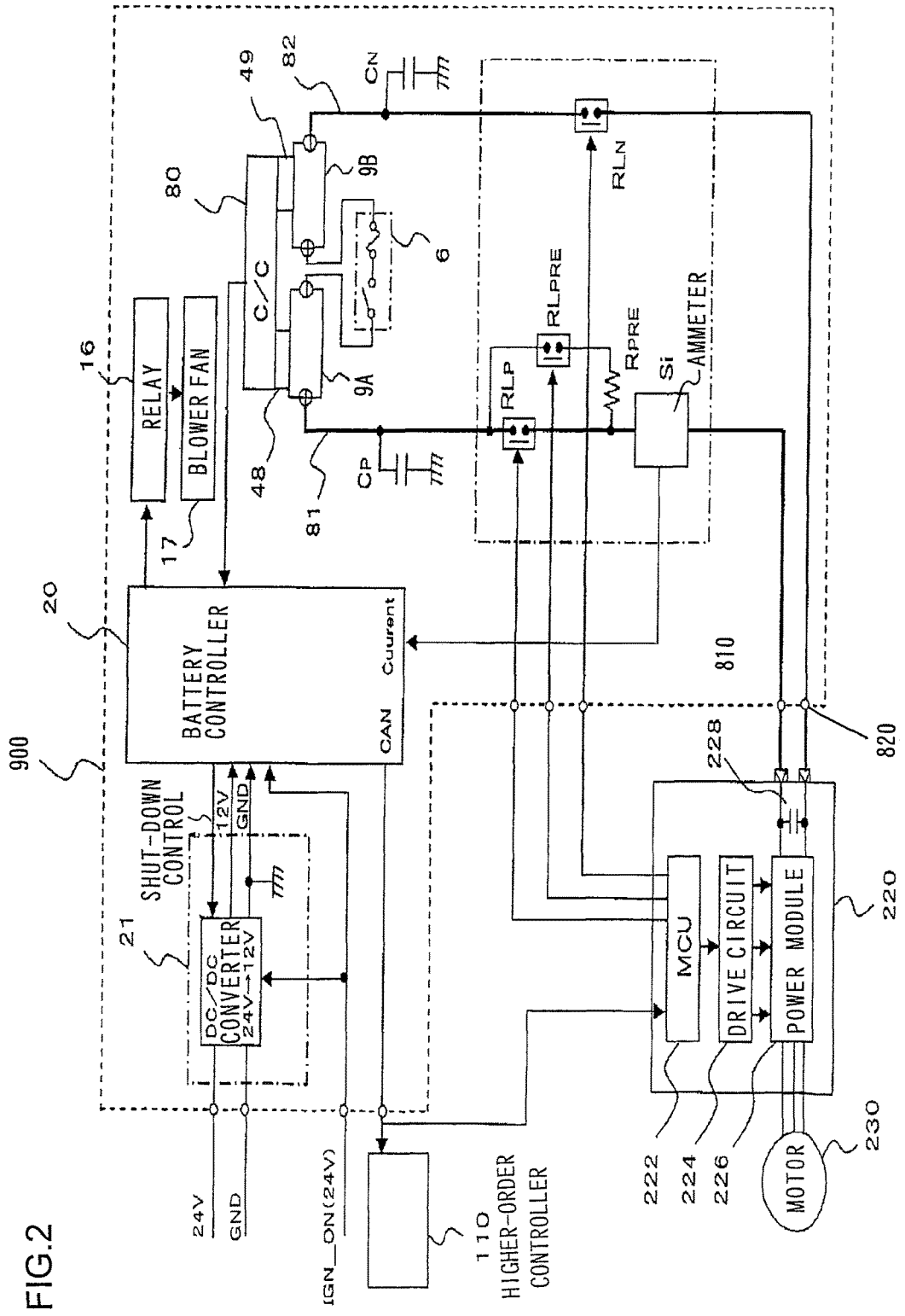
FIG. 2 is a diagram presenting a drive system for a vehicle rotating electrical machine on which the vehicle battery system shown in FIG. 1 is mounted.
Figure 3:
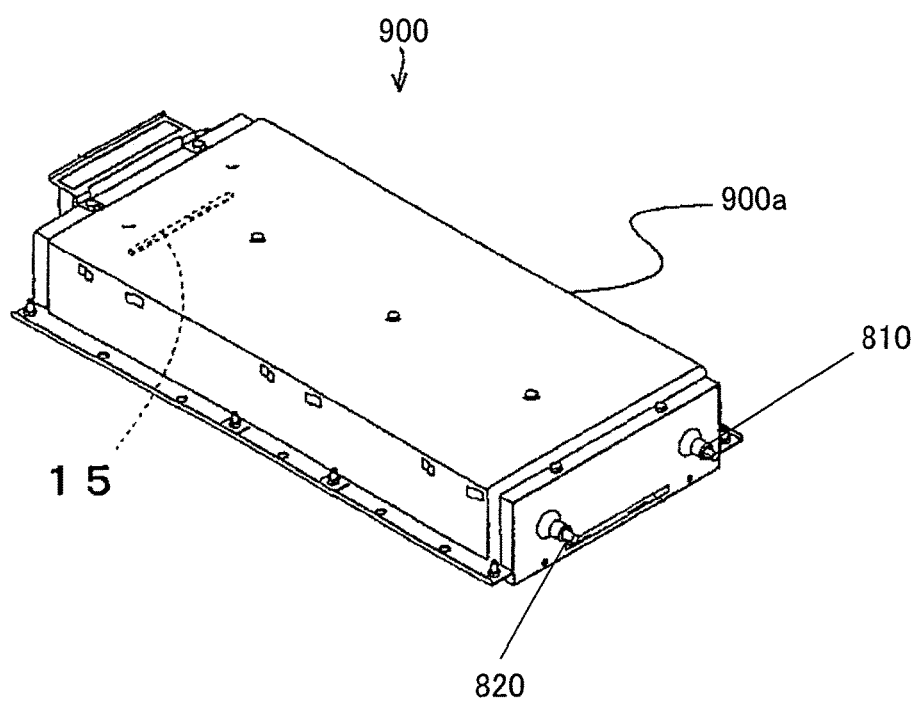
FIG. 3 is a perspective view showing an external appearance of a battery unit 900.
Figure 4:
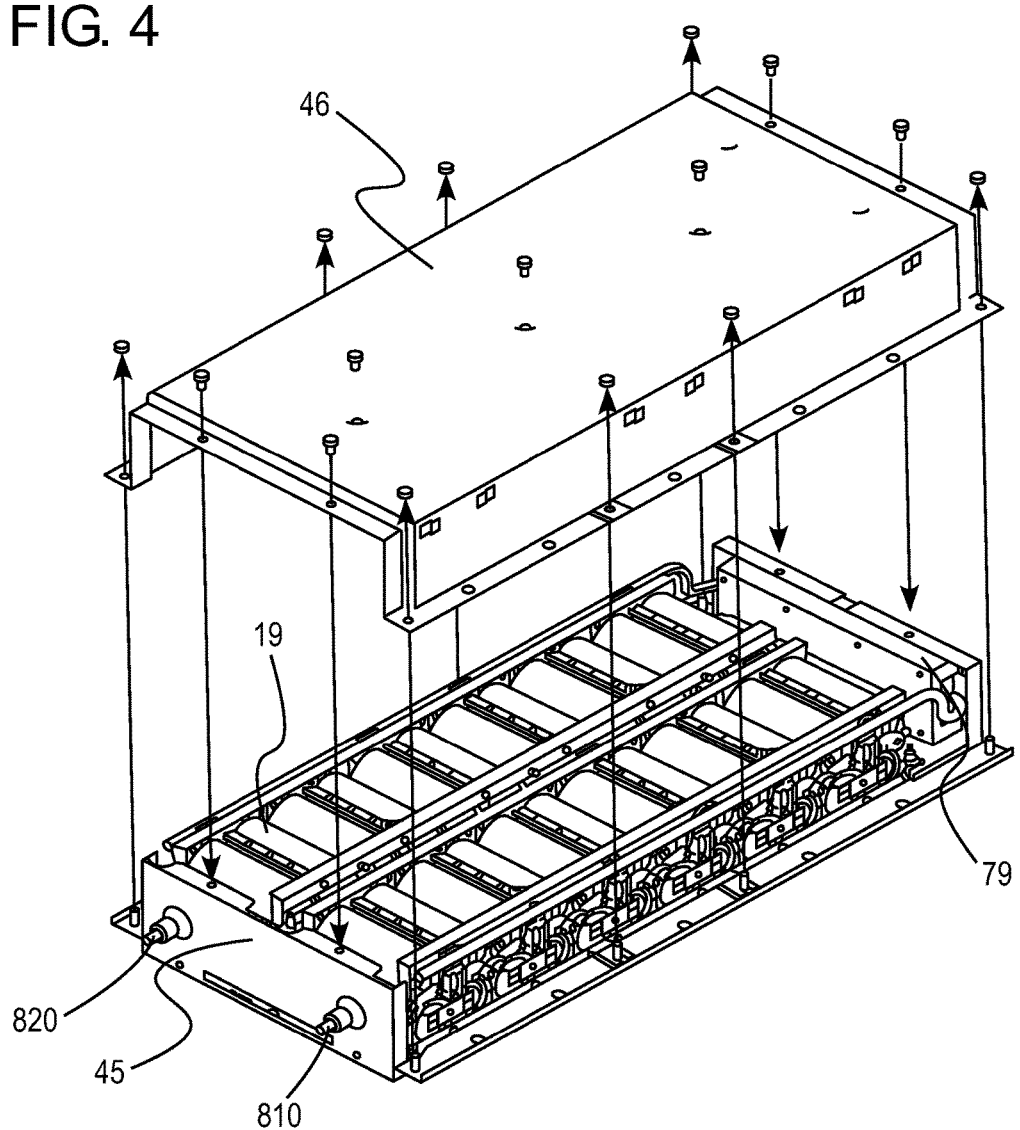
FIG. 4 is an exploded perspective view of the battery unit 900.
Figure 5:
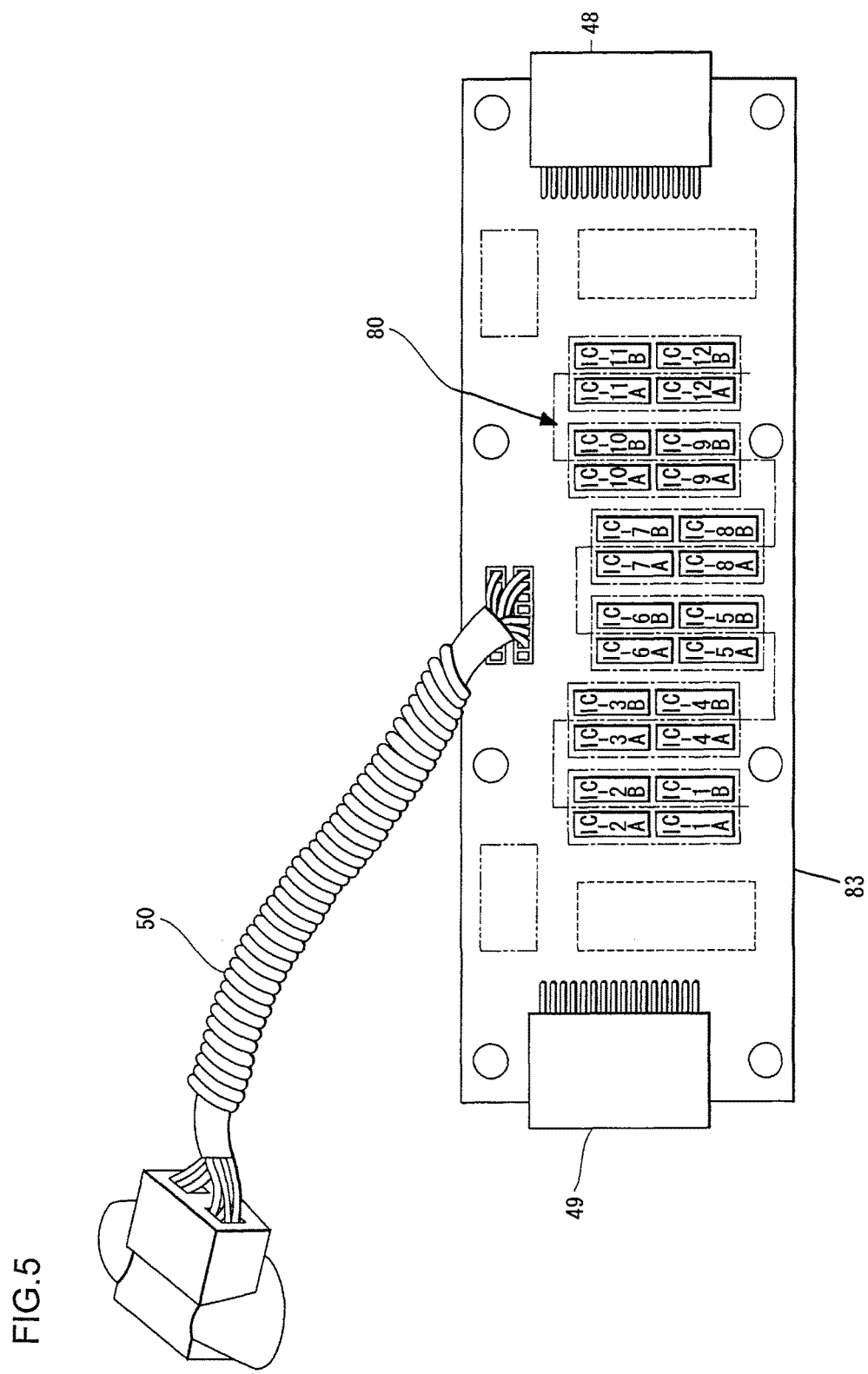
FIG. 5 illustrates a substrate 83 on which a cell controller 80 is provided.

Preferred embodiments for the present invention will now be explained with reference to the drawings. FIGS. 1~5 illustrate an embodiment of the vehicle battery system related to the present invention. FIG. 1 is a diagram showing a main part of the vehicle battery system. FIG. 2 is a diagram presenting a drive system for a vehicle rotating electrical machine on which the vehicle battery system is mounted. FIGS. 3~5 are illustrations showing the battery unit 900. Now, the drive system for the vehicle rotating electrical machine shown in FIG. 2 is explained first. Although an automobile is the most preferable vehicle on which the vehicle battery system is mounted, application to an electric train will also achieve a preferred result. The present invention may also be applied to an industrial machine, however an application to a vehicle will be described as a representative example.

FIG. 2 is a circuit diagram of the vehicle battery system achieved in an embodiment which is applied to a drive system for a vehicle rotating electrical machine. The drive system includes the battery unit 900 including a battery system, an inverter 220 that converts DC power from the battery unit 900 to three-phase AC power, a motor 230 for driving vehicle, a higher-order controller 110 that controls the battery unit 900 and the inverter 220. The motor 230 is driven by three-phase AC power from the inverter 220.

The battery unit 900 includes two battery modules 9A and 9B, a cell controller 80, and a battery controller 20. The battery module 9A and the battery module 9B are connected in series via a switchgear 6 which serves as a service disconnect for purposes of maintenance/inspection, constituted by serially connecting a switch and a fuse. A series circuit of an electric circuit is cut off by opening the switchgear 6, so that, even if a connection circuit is formed at any point between the battery modules 9A and 9B and the vehicle, any current does not flow. By adopting this structure, an even higher level of safety is assured.

The battery module 9A is constituted by connecting a plurality of battery cell groups each of which is constituted by a plurality of battery cells connected in series. The battery module 9B is constituted in a similar manner. The positive pole of the battery module 9A is connected to the positive pole of the inverter 220 via a positive pole high-rate cable 81 and a relay RLP. The negative pole of the battery module 9B is connected to the negative pole of the inverter 220 via a negative pole high-rate cable 82 and relay RLN. In addition, a serial circuit constituted with a resistor RPRE and a pre-charge relay RLPRE is connected in parallel to the relay RLP. An ammeter Si such as a Hall element or the like is inserted between the relay RLP and the inverter 220. The ammeter Si is installed in a junction box and its output line is led out to the battery controller 20.

The rated current of the relays RLP and RLN may be approximately 80 A, whereas the rated current of the pre-charge relay RLPRE may be approximately 10 A. In addition, a resistor with a rated capacity of 60 W and assuming a resistance value of approximately 50Ω may be utilized as the resistor RPRE. The rated current of the ammeter Si may be approximately ±200 A. The negative pole high-rate cable 82 and the positive pole high-rate cable 81 are connected to the inverter 220 that drives the motor 230, via the relay RLP and the relay RLN respectively and also via output terminals 810 and 820. This structure assures a high level of safety.

The inverter 220 is constituted with a power module 226, an MCU 222, a drive circuit 224 via which the power module 226 is driven and a smoothing capacitor 228 with large capacitance of approximately 700 μF~2000 μF. The power module 226 converts the DC power supplied from the battery modules 9A and 9B to three-phase AC power to be used to drive the motor 230.

The smoothing capacitor 228 constituted with a film capacitor rather than an electrolytic capacitor will provide better characteristics. The environment surrounding the vehicle is a factor that determines the condition under which the smoothing capacitor 228 installed in the vehicle operates. The smoothing capacitor 228 is likely to operate over a wide temperature range of, for instance, from a low temperature such as −20° C. or −30° C. to 100° C. When the temperature becomes lower than 0° C., the characteristics of an electrolytic capacitor will drastically deteriorate and its voltage noise removal performance will be negatively affected. Under such circumstances, the integrated circuits provided in the cell controller 80 may be subjected to very significant noise. The characteristics of a film capacitor, on the other hand, are not significantly compromised even at very low temperatures and thus, voltage noise applied to the integrated circuits can be effectively reduced with the film capacitor.

In response to an instruction issued from a higher-order controller 110, the MCU 222 charges the smoothing capacitor 228 by first switching the negative pole-side relay RLN from the open state to the closed state and then switching the pre-charge relay RLPRE from the open state to the closed state to drive the motor 230. Subsequently, it switches the positive pole-side relay RLP from the open state to the closed state thereby starting power supply from the battery modules 9A and 9B in the battery unit 900 to the inverter 220.

It is to be noted that the inverter 220 controls the phase of the AC power generated at the power module 226 relative to the rotor of the motor 230. In addition, when braking the hybrid vehicle, the inverter 220 executes regenerative braking control by engaging the motor 230 in operation as a generator, so as to charge the battery modules 9A and 9B with the power regenerated through generator operation. Also in the case where the state of charge at the battery modules 9A and 9B becomes lower than the reference level, the inverter 220 engages the motor 230 in operation as a power generator. The three-phase AC power generated at the motor 230 is converted to DC power via the power module 226 and the DC power resulting from the conversion is then supplied to the battery modules 9A and 9B. As a result, the battery modules 9A and 9B are charged.

When the motor 230 is to be engaged in operation as a motor, in response to an instruction issued by the higher-order controller 110, the MCU 222 controls the drive circuit 224 so as to generate a rotating magnetic field along the advancing direction relative to the rotation of the rotor in the motor 230 in order to control the switching operation at the power module 226. In this situation, DC power is supplied from the battery modules 9A and 9B to the power module 226. On the other hand, in the case where the battery modules 9A and 9B are charged by regenerative braking control, the MCU 222 controls the drive circuit 224 so as to generate a rotating magnetic field along the retarding direction relative to the rotation of the rotor in the motor 230 to control the switching operation at the power module 226. Under such circumstances, power is supplied from the motor 230 to the power module 226 and DC power from the power module 226 is then supplied to the battery modules 9A and 9B. As a result, the motor 230 functions as a power generator.

The power module 226 in the inverter 220 executes on/off operation at high speed to achieve DC/AC power conversion. At this time, a large electric current may be cut off at high-speed and, in such a case, a significant voltage fluctuation will occur due to the inductance of the DC circuit. The smoothing capacitor 228 with large capacitance is installed in the DC circuit in order to inhibit such a voltage fluctuation. The heat generated at the power module 226 poses a serious problem in the on vehicle inverter 220 and the speed with which the power module 226 is switched into the continuous state and the cut off state must be increased in order to reduce the heat generation. However, if the operation speed is raised, the extent to which the voltage jumps due to the inductance also increases as described above, which, in turn, generates more noise. For this reason, the smoothing capacitor 228 tends to assume a greater capacity.

At the start of operation of the inverter 220, the smoothing capacitor 228 holds substantially no electrical charge and, as the relay RLP is closed, a large initial current starts to flow into the smoothing capacitor 228. Due to the large current, the negative pole-side main relay RLN and the positive pole-side main relay RLP may become fused and damaged. In order to prevent this, the MCU 222 first switches the negative pole-side relay RLN from the open state to the closed state, switches the pre-charge relay RLPRE from the open state to the closed state while holding the positive pole-side relay RLP in the open state and charges the smoothing capacitor 228 by regulating the maximum current via the resistor RPRE.

Once the smoothing capacitor 228 is charged to a predetermined voltage, the initial state is cleared. More specifically, an initial charge to the smoothing capacitor 228 via the pre-charge relay RLPRE or the resistor RPRE is stopped, and, as described above, the negative pole-side relay RLN and the positive pole-side relay RLP are set in the closed state so as to supply the DC power to the power module 226. Under this control, the relay circuit is effectively protected and the maximum current that may flow through the lithium ion battery cells and the inverter 220 is regulated so as not to exceed a predetermined value, thereby assuring a high level of safety.

Since the occurrence of noise voltage can be inhibited by reducing the inductance in the DC-side circuit of the inverter 220, the smoothing capacitor 228 is disposed in close proximity to a DC-side terminal of the power module 226. In addition, the smoothing capacitor 228 itself assumes a structure that reduces the inductance. As the initial charge current at the smoothing capacitor 228 structured as described above is supplied, a large electrical current flows in momentarily and significant heat generated at this time may damage the smoothing capacitor. However, the extent of such damage can be lessened by limiting the charge current via the pre-charge relay RLPRE and the resistor RPRE. While the MCU 222 controls the inverter 220, the initial charge of the smoothing capacitor 228 is also executed under control of the MCU 222.

A capacitor CN is inserted between a connecting cable, which connects the negative pole of the battery module 9B in the battery unit 900 with the negative pole-side relay RLN, and the case ground (assuming a potential equal to that at the vehicle chassis). A capacitor CP is inserted between a connecting cable, which connects the positive pole of the battery module 9A with the positive pole-side relay RLP, and the case ground. The capacitors CN and CP are installed in order to prevent erroneous operation of the low-rate electrical circuit and destruction of the integrated circuit constituting the cell controller 80 due to a surge voltage, by eliminating noise generated via the inverter 220. While the inverter 220 includes a noise removal filter, the capacitors CN and CP are installed so as to even more effectively prevent erroneous operations of the battery controller 20 and the cell controller 80 and improve the noise withstanding reliability of the battery unit 900.

It is to be noted that in FIG. 2, the high-rate electrical circuit in the battery unit 900 is indicated by the bold line. The high-rate electrical circuit is wired by using a flat copper wire with a large sectional area. In addition, a blower fan 17, which cools the battery modules 9A and 9B, is engaged in operation via a relay 16 that is turned on in response to a command from the battery controller 20.

FIGS. 3 and 4 present a specific structural example that may be adopted in the battery unit 900. FIG. 3 is a perspective view showing an external appearance of the battery unit 900. FIG. 4 is an exploded perspective view thereof. The battery unit 900 includes a cuboid metal battery case 900a constituted with an upper lid 46 and a lower lid 45. The lower lid 45 is provided with the output terminals 810 and 820 via which DC power is supplied or is received.

A plurality of battery assemblies (battery cell groups) 19 constituted by a plurality of battery cells are housed and fixed within the battery case 900a. While numerous wirings for purposes of voltage and temperature detection are laid out within components constituting the battery unit 900, these wirings are electrically protected against external noise with the metal battery case 900a enclosing the battery unit 900. In addition, as explained earlier, since the battery cells are protected via the battery case 900a and an outer container encasing the battery case, the power supply system safety is assured even in the event of a traffic accident.

The battery cells in the present embodiment are lithium ion secondary batteries assuming a columnar shape, each made up with a positive pole active substance constituted of a lithium-manganese double oxide and a negative pole active substance constituted of amorphous carbon. The battery cells are each encased within a casing achieving a high level of thermal conductivity. While the nominal voltage and the capacity of such a battery cell constituted with a lithium ion secondary battery are respectively 3.6 V and 5.5 Ah, the terminal voltage at the battery cell fluctuates as the state of charge changes. For instance, the terminal voltage may become as low as 2.5 V as the SOC level at the battery cell decreases, whereas it may rise as high as 4.3 V as the SOC level at the battery cell increases.

As FIGS. 3 and 4 show, the lower lid 45 is provided with a plurality of battery assemblies 19 arranged and fixed in two rows longitudinally in the case. A plurality of battery assemblies 19 in one row constitute the battery module 9A, and a plurality of battery assemblies 19 in the other row constitute the battery module 9B. At one end of the lower lid 45, a cell controller box 79 is fixed via screws. A substrate 83, on which the cell controller 80 shown in FIG. 5 is provided, is fixed in the cell controller box 79.

The substrate 83 is fixed in the cell controller box 79 in an upright orientation with screws threaded through round holes formed at four positions on the upper side and two positions on the lower side. Such a structure allows the entire battery unit 900 to be fitted within a relatively small space. In addition, the individual battery assemblies 19 and the cell controller 80 can be wired relatively easily. Connectors 48 and 49 are disposed over a distance from each other at the two ends of the substrate 83 on the left side and the right side. The connectors 48 and 49 are connected to the battery cells of the battery modules 9A and 9B via a detection harness.

A communication harness 50, to be used to communicate with the battery controller 20, is led out from the substrate 83. The communication harness 50 includes a connector disposed at the front end thereof. This connector is connected to a connector (not shown) at the battery controller 20. It is to be noted that while chip elements such as resistors, capacitors, photocouplers, transistors and diodes are mounted at the substrate 83, FIG. 5 does not include an illustration of these elements, for purposes of simplification. The connectors 48 and 49 are disposed in correspondence to the two battery modules 9A and 9B at the substrate 83, and the communication harness 50 provided as a member independent of the connectors, is also disposed at the substrate so as to enable communication with the battery controller 20. Since the connectors 48 and 49 and the communication harness 50 are disposed independently of each other, maintenance and wiring work is facilitated.

One of the connectors 48 and 49 is used to connect the serially connected high-voltage side battery cells with the substrate 83 and the other connector 48 or 49 is used to connect the serially connected low-voltage side battery cells with the substrate 83. As a result, the voltage difference manifesting over the ranges managed via the individual connectors can be reduced. While the state of partial connection, in which only a partial connection exists momentarily when the connectors are being connected or disconnected, the adverse effect of such partial connection can be reduced by reducing the voltage difference manifesting over the ranges managed via the individual connectors.

The battery modules 9A and 9B fixed side-by-side at the lower lid 45 are connected in series via the switchgear 6, which serves as a service disconnect (not shown). The front surface of the lower lid 45 is provided thereat with the output terminals 810 and 820 via which the electric power flowing through the positive pole high-rate cable 81 and the negative pole high-rate cable 82 is supplied or received externally.

(Explanation of Transmission Path)

A communication transmission path between the cell controller 80 shown in FIG. 2 and the battery controller 20, which operates as a higher-order control circuit, will now be explained in detail. It is to be noted that the cell controller 80 shown in FIG. 2 is constituted with a plurality of integrated circuits shown in FIG. 1, which are CC3A, CC3B, . . . , CC3N, CC4A, CC4B, . . . , and CC4N. The integrated circuits CC3A~CC4N are now referred to as battery cell controller CC3A~CC4N.

FIG. 1 shows the battery modules 9A and 9B, the battery cell controllers CC3A~CC4N, the transmission path 60, and the battery controller 20. As described earlier, the battery module 9A and the battery module 9B are connected in series via the switchgear 6. The positive pole of the battery module 9A is connected to the high-rate cable 81, while the negative pole of the battery module 9B is connected to the high-rate cable 82.

The battery modules 9A and 9B are each constituted with a plurality of battery cell groups. Although the battery cell groups each constituted with six lithium ion battery cells BC1~BC6 are assumed in the embodiment, four lithium ion battery cells or mixture of four and six lithium ion battery cells may be assumed. Electric power supply may not be achieved by combination of fixed number of, four or six, battery modules. In the present embodiment, the different number of battery modules, i.e., four or six, can be connected to the integrated circuits, the number of lithium ion battery cells can be optimized depending on the state of the power to be supplied.

Battery cell controllers CC3A, CC3B, . . . , and CC3N are provided corresponding to each of the cell groups in the battery module 9A, while battery cell controllers CC4A, CC4B, . . . , and CC4N are provided corresponding to each of the cell groups in the battery module 9B. In other words, the battery module 9A is provided with a battery cell controller group CCG1 constituted with the battery cell controllers CC3A, CC3B, . . . , and CC3N, while the battery module 9B is provided with a battery cell controller group CCG2 constituted with the battery cell controllers CC4A, CC4B, . . . , and CC4N.

Although other battery cell controllers assuming similar structures are present between the battery cell controller CC3B and the battery cell controller CC3N and between the battery cell controller CC4B and the battery cell controller CC4N in FIG. 1, an illustration of the other battery cell controllers is not included therein for purposes of simplification. In addition, the battery module 9A, the battery cell controller group CCG1, and the transmission path 60, which are illustrated in the upper half of FIG. 1, and the battery module 9B, the battery cell controller group CCG2, and the transmission path 60, which are illustrated in the lower half thereof, adopt structures identical to one another. The structure illustrated in the upper half thereof, which is related to the battery module 9A, is hereinafter referred to explain the details.

Transmission and reception of signals are performed between the battery controller 20 and each of the battery cell controllers CC3A, CC3B, . . . , and CC3N via the transmission path 60. The battery cell controllers CC3A, CC3B, . . . , CC3N are each connected in series via transmission paths 602 and 604. A command signal transmitted from a transmission terminal TX1 of the battery controller 20 to the battery cell controllers CC3A, CC3B, . . . , and CC3N via a looped communication path. Data corresponding to the command travels through the looped communication path constituted by the battery cell controllers CC3A, CC3B, . . . , and CC3N, and is received at a reception terminal RX1 of the battery controller 20.

Namely, the command signal transmitted from the transmission terminal TX1 of the battery controller 20 is received at the reception terminal RX of the battery cell controller CC3A via the transmission path 60. Data or a command corresponding to the command signal is transmitted from a transmission terminal TX of the battery cell controller CC3A. The command signal received at the reception terminal RX of the battery cell controller CC3B is transmitted from the transmission terminal TX. Reception and transmission are performed in sequence in this manner, and a transmission signal is transmitted from the transmission terminal TX of the battery cell controller CC3N and is received at the reception terminal RX1 of the battery controller 20. Serial communication is executed via this looped communication path. In response to the received command signal, the battery cell controllers CC3A, CC3B, . . . , and CC3N each start detection and diagnosis of terminal voltage at the battery cells BC1~BC6 constituting the corresponding battery cell group, and, based upon the command signal, transmit the data collected or detected by each of the battery cell controllers to the battery controller 20 through serial communication as described above.

The battery cell controllers CC3A, CC3B, . . . , and CC3N each execute an abnormality diagnosis and transmit a one-bit signal via the transmission path 604 in the event of an abnormality. The battery cell controllers CC3A, CC3B, . . . , and CC3N each transmit an abnormality signal from a transmission terminal FFO if it is determined that an abnormality has occurred in the battery cell controller itself or if a signal indicating an abnormality (abnormality signal) transmitted from the preceding battery cell controller is received at a reception terminal FFI1. If, on the other hand, an abnormality signal which has already been received at the reception terminal FFI1 disappears or if an abnormal decision having been made with regard to the subject battery cell controller is switched to a normal decision, the abnormality signal to be transmitted from a transmission terminal FFO1 is switched to a normal signal.

While the battery controller 20 does not usually transmit an abnormality signal to the integrated circuits, it transmits a test signal, i.e., a dummy abnormality signal to be used in diagnosis of the abnormality signal transmission path for the correct operating state, from a transmission terminal FFOUT1 of the battery controller 20. The test signal, i.e., the dummy abnormality signal, is transmitted from the transmission terminal FFOUT1 of the battery controller 20 to the reception terminal FFI of the battery cell controller CC3A via the transmission path 604. In response to the test signal, a test signal is transmitted from the transmission terminal FFO of the battery cell controller CC3A to the reception terminal FFI of the next battery cell controller CC3B. The test signal is transmitted in sequence to the next battery cell controller, and is transmitted from the transmission terminal FFO of the battery cell controller CC3N to a reception terminal FFIN1 of the battery controller 20 via the transmission path 604.

The battery controller 20, grounded (GND) at the potential assumed at the vehicle chassis, operates at a low voltage of 5 V or the like generated by a power supply of 14 V system. On the other hand, a power supply system constituted with the lithium ion battery cells is electrically insulated from the power supply of 14 V system. In addition, in the embodiment, the battery cell controllers CC3A, CC3B, . . . , and CC3N are each engaged in operation as a voltage representing the difference between the highest potential and the lowest potential in the corresponding battery cell group is supplied thereto. Thus, the power supply system for the battery controller 20 and the power supply system for the cell controller 80 (each of the battery cell controllers CC3A CC3B, . . . , and CC3N) are different in potential from each other and the values of the voltages generated therein also differ greatly. Accordingly, reliability is increased by providing insulating circuits (photocouplers PH1~PH4) in the transmission path 60, which connects the battery controller 20 with the cell controller 80 so as to electrically insulate the both controllers. It is to be noted that in FIG. 1, the photocoupler PH1 and the photocoupler PH2 are identical to each other, while the photocoupler PH3 and the photocoupler PH4 are identical to each other.

All the battery cells in the battery module 9A are used for a power supply for the photocouplers PH3 and PH4 to transmit from the battery cell controller group CCG1 to the battery controller 20, and the total voltage VCC at the battery module 9A is applied to the photocouplers PH3 and PH4. A photocoupler can not perform high speed communication unless a certain amount of current is applied thereto. Since it is arranged that the photocouplers PH3 and PH4 are driven by the total voltage at the battery module 9A and that electric power is supplied from all the battery cells in the battery module 9A to the photocouplers PH3 and PH4, power consumption due to transmission can be prevented from being assumed unequally by some of the battery cells in the battery module 9A, thereby preventing variation from occurring in charge amount among the battery cells in the battery module 9A.

It is to be noted that although the total voltage in all of the battery cell groups in the battery module 9A is arranged to be applied to the photocouplers PH3 and PH4, variations in charge amount among battery cells in the corresponding battery cell group can be prevented even if electric power is supplied from not all but some of the battery cell groups. For example, voltage between a GND terminal of the battery cell controller group CC3N and a VCC terminal of the battery cell controller group CC3B may be applied to the photocouplers PH3 and PH4.

In addition, the photocoupler PH3 is driven via a constant current circuit 613. The photocoupler PH3, which performs data transmission, requires a certain amount of current applied thereto as described above, and requires a constant current so as to extend its life under such conditions. A low current reduces the amount of LED luminescence of the photocoupler PH3, thereby resulting in less output and lower reliability in signal transmission, while an excessive current reduces the life of the photocoupler PH3. On the other hand, as the voltage at the battery module 9A varies, the current flowing through the photocoupler PH3 varies and failure as described above may occur.

Therefore, the constant current circuit 613 is provided so as to supply a constant current to the photocoupler PH3 without regard to voltage, thereby preventing deterioration in reliability of signal transmission and deterioration in the life of the photocoupler. In addition, since the current flowing through a photocoupler is determined by a resistor that is connected, the magnitude of the current flowing in the case where there is a voltage difference between the battery module 9A and the battery module 9B varies, thereby resulting in variations in power consumption. However, the constant current circuit 613, which uniforms the current value supplied to the photocoupler PH3, can equalize power consumption with regard to signal transmission between the battery module 9A and the battery module 9B.

On the other hand, electric power to drive a light receiving element output circuit of the photocouplers PH1 and PH2, which receive signals from the battery controller 20, is supplied from the battery cell group with regard to the battery cell controller CC3A. A switch SW01 is provided in a transmission path between the photocoupler PH1 for data transmission and reception and the battery cell controller CC3A, and operating voltage for the photocoupler PH1 is supplied via the switch SW01. An OR circuit OR01 is provided on the base side of the switch SW01. The switch SW01 is engaged in operation when a signal is transmitted from a flag transmission terminal FFOUT1 of the battery controller 20 or when the battery cell controller CC3A generates an internal voltage VDD.

High dark current flows through the photocoupler PH1 for data transmission and reception during standby, and a wasteful power consumption caused thereby becomes an issue. Accordingly, when the cell controller 80 is in the sleep state in which the transmission path is not used, the OR circuit OR01 turns the switch SW01 off so as to cut off the power supply to the photocoupler PH1. As a result, wasteful power consumption can be prevented.

At starting operations of the battery cell controller groups CCG1 and CCG2, a start signal is output from flag transmission terminals FFOUT1 and FFOUT2 of the battery controller 20. The start signal causes the photocoupler PH2 to be driven, the OR circuit OR01 to turn the switch SW01 on, and the light receiving element circuit of the photocoupler PH1 to be set into an enabled state. Subsequently, the battery controller 20 outputs from the transmission terminal TX1 a transmission signal that contains data and a command. The transmission signal is input to the reception terminal RX of the battery cell controller CC3A via the photocoupler PH1, and the battery cell controller CC3A is engaged in operation. When the battery cell controller CC3A starts operating, a voltage VDD, to be detailed later, is output from a terminal VDD of the battery cell controller CC3A, allowing a base current to flow through the switch SW01 and maintaining power supply to the photocoupler PH1.

The battery module 9A and the battery module 9B are removably connected via the switchgear 6 as described earlier. An exterior case of the battery unit 900 can not opened unless the switchgear 6 is unlocked. Unlocking the switchgear 6 causes an electrical open/close circuit between the battery module 9A and the battery module 9B, which are connected in series, to be opened, and causes an open/close detection switch provided in the switchgear 6 to be opened.

When a pulse signal is output from a terminal PORTOUT of the battery controller 20, the pulse signal is input via a terminal PORTIN if the open/close detection switch in the switchgear 6 is closed. On the other hand, transmission of the pulse signal is cut off if the switchgear 6 is opened and the open/close detection switch is opened. A line connecting the terminal PORTIN with the open/close detection switch is connected to the ground via a resistor 620. Accordingly, in a state where transmission of the pulse signal is cut off, an input potential at the terminal PORTIN is held at ground potential.

The battery controller 20 detects the open/close state of the open/close detection switch in the switchgear 6 depending upon an input potential at the terminal PORTIN. Upon detecting opening of the switchgear 6, the battery controller 20 transmits the opening state of the switchgear 6 to a relevant control device such as the inverter 220, controlling so as to maintain safety of the whole system. For instance, when the switchgear 6 is opened, charge of the battery modules 9A and 9B by the inverter 220 is prohibited. It is to be noted that although the above explanation referred to the structure related to the battery module 9A, the transmission path 60 of the battery module 9B assuming the similar structure achieves the similar advantages.

Advantageous effects of the battery system shown in FIG. 1 are summarized as follows.

(a) Since the transmission path 60 connecting the battery controller 20 with the cell controller 80 is provided with insulating circuits (photocouplers PH1~PH4) for electrical insulation, reliability is improved.

(b) As electric power is supplied from all of the battery cells of the battery module 9A to the photocouplers PH1 and PH2, power consumption of the photocouplers can be prevented from being assumed unequally by some of the battery cells in the battery module 9A. This results in preventing variation from occurring in charge amount among the battery cells in the battery module 9A.

(c) The constant current circuit 613 is provided so as to supply a constant current to the photocoupler PH3 regardless of the total voltage at the battery module 9A, thereby preventing deterioration in reliability of signal transmission and deterioration in the life of the photocoupler, and equalizing power consumption with regard to signal transmission between the battery module 9A and the battery module 9B.

(d) In the case where the cell controller 80 is in the sleep state in which the transmission path is not used, the switch SW01 is turned off so as to cut off the power supply to the photocoupler PH1. As a result, wasteful power consumption can be prevented.

(e) The open/close state of the open/close detection switch in the switchgear 6 can be detected, thereby improving safety of the whole system.

Figure 6:
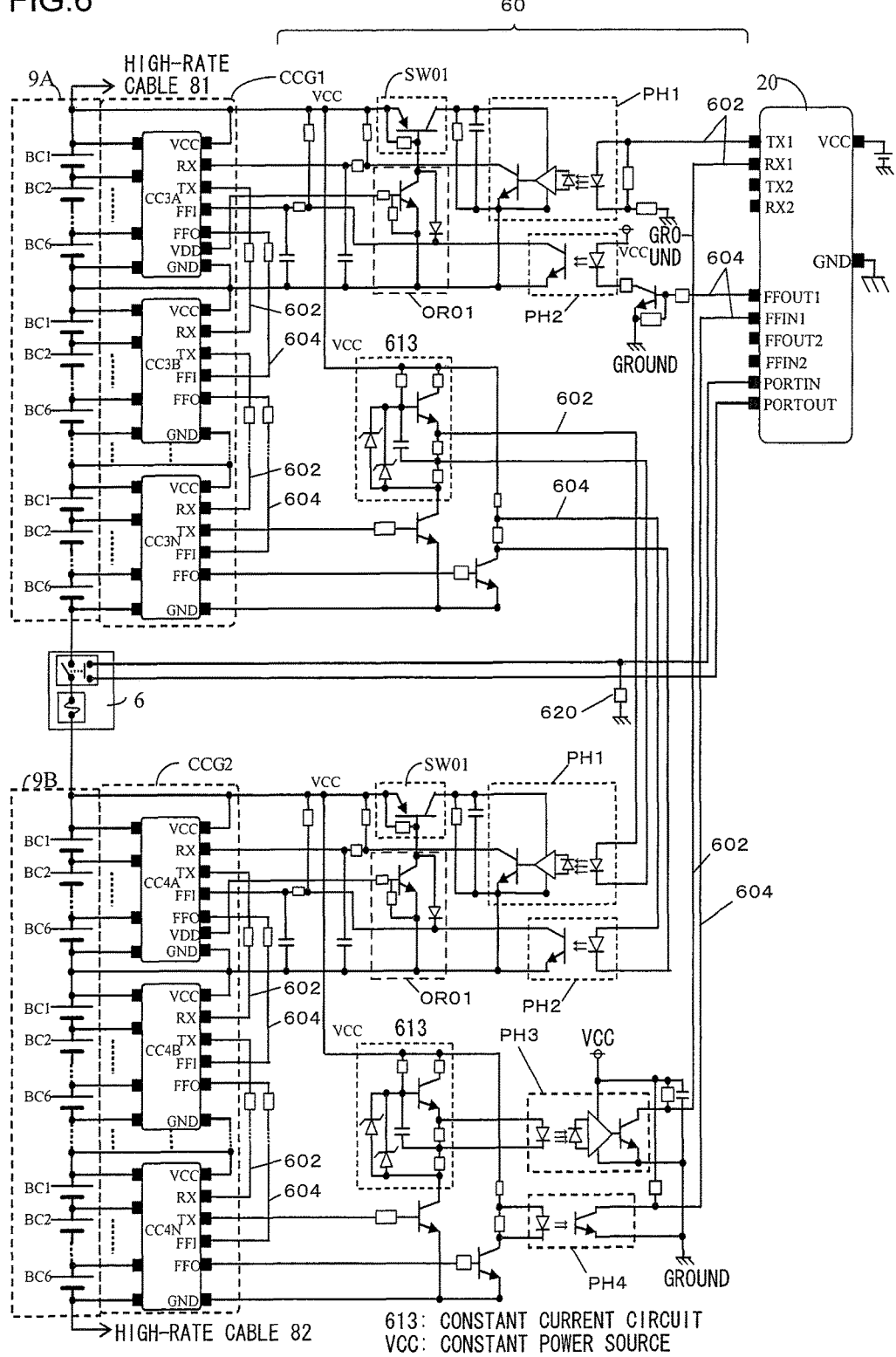
FIG. 6 illustrates another example of a transmission path 60.

FIG. 6 illustrates another example of a transmission path 60. In the system described above in FIG. 1, signals output from the transmission terminals TX and FFO of the battery cell controller CC3N in the battery module 9A are respectively received at the reception terminals RX1 and FFIN1 of the battery controller 20 via the photocouplers PH3 and PH4. In addition, signals output from the transmission terminals TX and FFO of the battery cell controller CC4N in the battery module 9B are respectively received at the reception terminals RX2 and FFIN2 of the battery controller 20 via the photocouplers PH3 and PH4. In other words, separate communication loops are each provided in the battery cell controller group CCG1 and the battery cell controller group CCG2.

On the other hand, in the example shown in FIG. 6, signals output from the transmission terminals TX and FFO of the battery cell controller CC3N in the battery module 9A are respectively received at the corresponding reception terminals RX and FFI of the battery cell controller CC4A in the battery module 9B. The transmission paths 602 and 604, which are connected respectively to the transmission terminals TX and FFO of the battery cell controller CC3N in the battery module 9A, are connected to the photocouplers PH1 and PH2 for receiving in the battery module 9B. Namely, the transmission terminals TX and FFO of the battery cell controller CC3N in the battery module 9A and the reception terminals RX and FFI of the battery cell controller CC4A in the battery module 9B are connected respectively to each other via the photocouplers PH1 and PH2, which are insulating circuits.

In the structure shown in FIG. 1, the communication loop on the battery module 9A side and the communication loop on the battery module 9B side are provided separately. In the structure shown in FIG. 6, on the other hand, the battery cell controller group CCG1 and the battery cell controller group CCG2 are connected in series to constitute one communication loop, which, although transmission performance is slow, the number of input-output terminals of the battery controller 20, which is a higher-order control device, may be advantageously reduced. In the structure shown in FIG. 6, the battery cell controller group CCG1 and the battery cell controller group CCG2, which are respectively related to the battery modules 9A and 9B removably connected to each other via the switch gear 6, perform signal transmission and reception via the insulating circuits (photocouplers PH1 and PH2), thereby improving reliability as in the case of FIG. 1. In other words, in the embodiment shown in FIG. 6, when the switchgear 6 is opened, connection between the lithium ion battery cell BC6 constituting the battery module 9A and the lithium ion battery cell BC1 constituting the battery module 9B is opened, and the circuit of current flowing through the battery module 9A and the battery module 9B is cut off, thereby improving safety.

On the other hand, in the state where the switchgear 6 is closed, the GND terminal of the integrated circuit CC3N and the VCC terminal of the integrated circuit CC4A are electrically connected to each other, and the potentials of the integrated circuit CC3N and the integrated circuit CC4A are held at a predetermined value and therefore they are stable. When the switchgear 6 is opened, the GND terminal of the integrated circuit CC3N and the VCC terminal of the integrated circuit CC4A are electrically opened, the potential between the integrated circuits is not determined. In this state, if there are electrical connection relationship between the transmission terminals of the integrated circuit CC3N, "RX", "RT", "FFI", and "FFO" and those of the integrated circuit CC4A, "RX", "RT", "FFI", and "FFO", potential difference between the integrated circuit CC3N and the integrated circuit CC4A is applied to the connection. Since the integrated circuit CC3N and the integrated circuit CC4A do not have high voltage tolerance, a factor occurring somewhere in the system such as electrical leakage causes potential difference between the integrated circuits when the switchgear 6 is opened, and may result in electrical damage in the integrated circuits. In FIG. 6, however, reliability is improved because the transmission paths in the integrated circuit CC3N and the integrated circuit CC4A related to the both ends of the switchgear 6 are connected to each other via the insulating circuit.

It is to be noted that although the examples shown in FIG. 1 and FIG. 6 assume a method of transmission from the higher potential-side toward the lower potential-side, a method of transmission from the lower potential-side toward the higher potential-side or a method of data loopback using both of these methods may be assumed. A circuit for transmission from the lower potential-side toward the higher potential-side will be described later.

Figure 7:
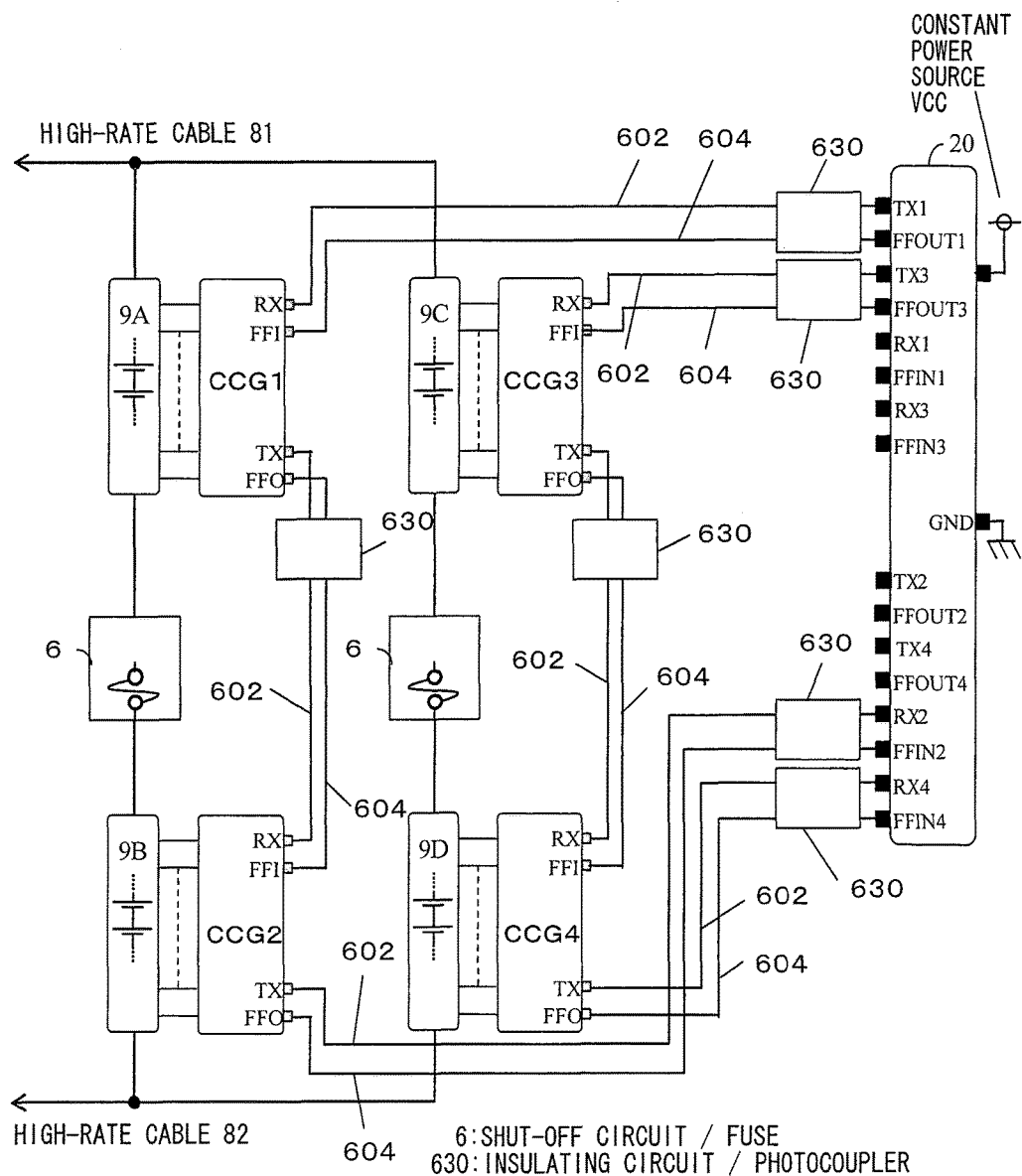
FIG. 7 presents a modification of the battery system shown in FIG. 6.

The battery system shown in FIG. 7, a modification of the battery system shown in FIG. 6, includes serially connected battery modules 9C and 9D that are connected in parallel to the battery modules 9A and 9B shown in FIG. 6. The battery modules 9C and 9D are removably connected via the switchgear 6 and provided with battery cell controller groups CCG3 and CCG4, which assume structures similar to those of the battery cell controller groups CCG1 and CCG2 shown in FIG. 1.

The reception terminals RX and FFI of the battery cell controller group CCG3 are connected via an insulating circuit 630 respectively to transmission terminals TX3 and FFOUT3 provided in the battery controller 20. The transmission terminals TX and FFO of the battery cell controller group CCG4 are connected via the insulating circuit 630 respectively to transmission terminals reception terminals RX4 and FFIN4 provided in the battery controller 20. In addition, the transmission terminals TX and FFO of the battery cell controller group CCG3 are connected via the insulating circuit 630 respectively to the reception terminals RX and FFI of the battery cell controller group CCG4. The insulating circuit 630 of FIG. 7 corresponds to the photocouplers PH1 and PH2 shown in FIG. 6. It is to be noted that in FIG. 6 the photocoupler PH1 and the photocoupler PH3 are identical to each other, and the photocoupler PH2 and the photocoupler PH4 are identical to each other. The transmission path configured in this manner improves reliability.

Figure 8:
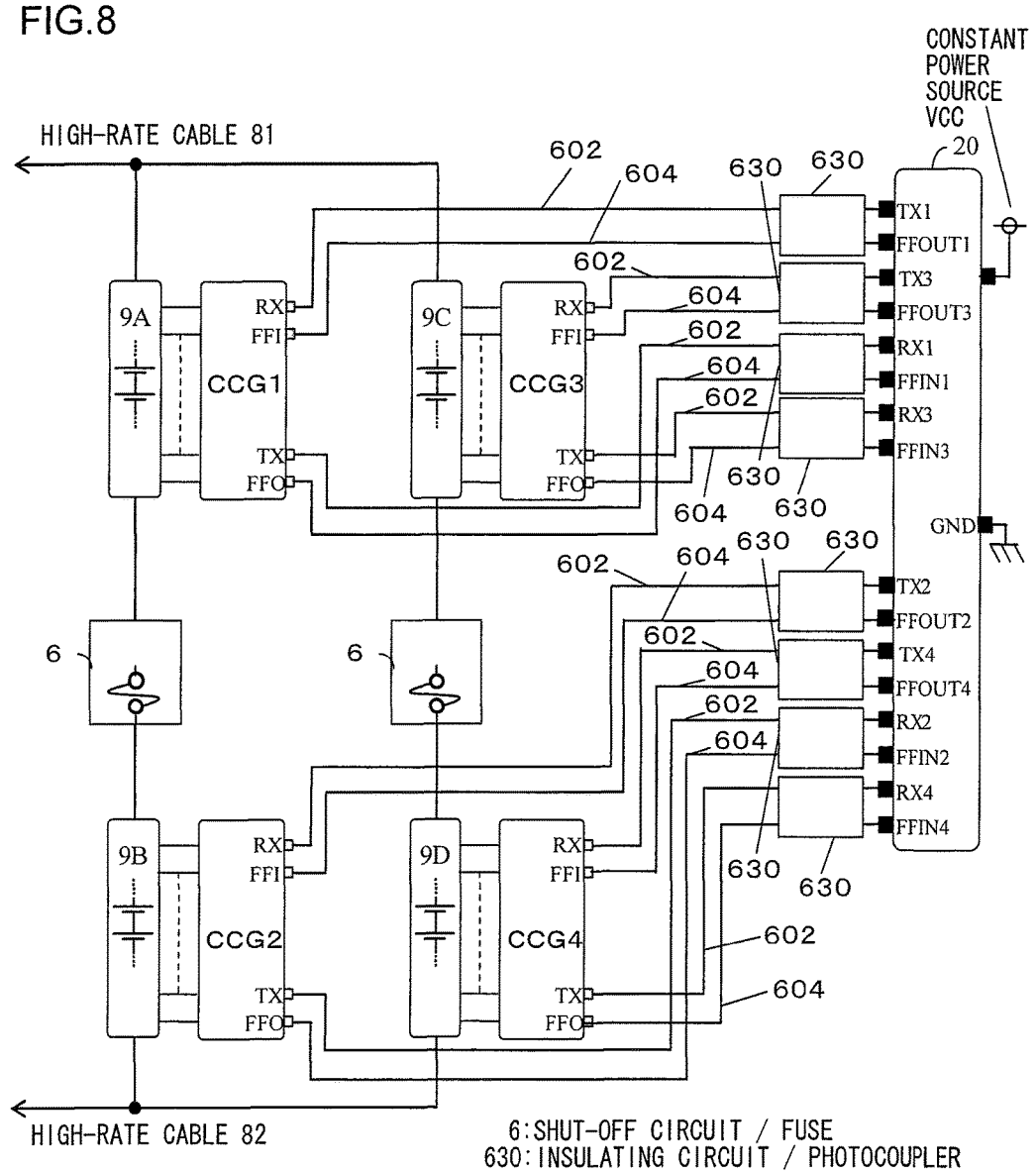
FIG. 8 presents a modification of the battery system shown in FIG. 1.

The battery system shown in FIG. 8, a modification of the battery system shown in FIG. 1, includes the battery modules 9C and 9D, which have the same structures as the battery modules 9C and 9D have, that are connected in parallel to the battery modules 9A and 9B shown in FIG. 1. The battery cell controller groups CCG1 and CCG2 of the battery modules 9A and 9B are each connected to the battery controller 20 via respective communication loops. In addition, the transmission paths 602 and 604 of the battery cell controller groups CCG3 and CCG4 in the battery modules 9C and 9D each constitute separate communication loops. The transmission paths 602 and 604 are each connected to the battery controller 20 via the insulating circuit 630. Since transmission between the integrated circuits at the both sides of the switchgear 6 and the higher-order control circuit is thus performed via the photocoupler 630, reliability when the switchgear 6 is opened is improved and a high speed transmission is realized due to parallel transmission paths.

As explained above, the transmission paths shown in FIG. 1 and FIG. 8 have a structure in which the integrated circuits at the both sides of the switchgear 6 and the battery controller 20, which is their higher-order control circuit, are connected via insulating circuits provided therebetween, for the purpose of transmission using the terminal TX or the terminal RX requiring high speed. On the other hand, the transmission paths shown in FIG. 6 and FIG. 7 have a structure in which transmission terminals of the integrated circuits at the both ends of the switchgear 6 are connected via insulating circuits provided therebetween, for the purpose of transmission using the terminal FFI and the terminal FFO, which is a relatively slow transmission. In this case, while high reliability and high-speed transmission are assured, the number of terminals of the battery controller 20, which is the higher-order control circuit of the integrated circuits, that are used for transmission can be reduced.

(Measure Against Short-Circuit Current and Measure Against Noise)

Figure 9:
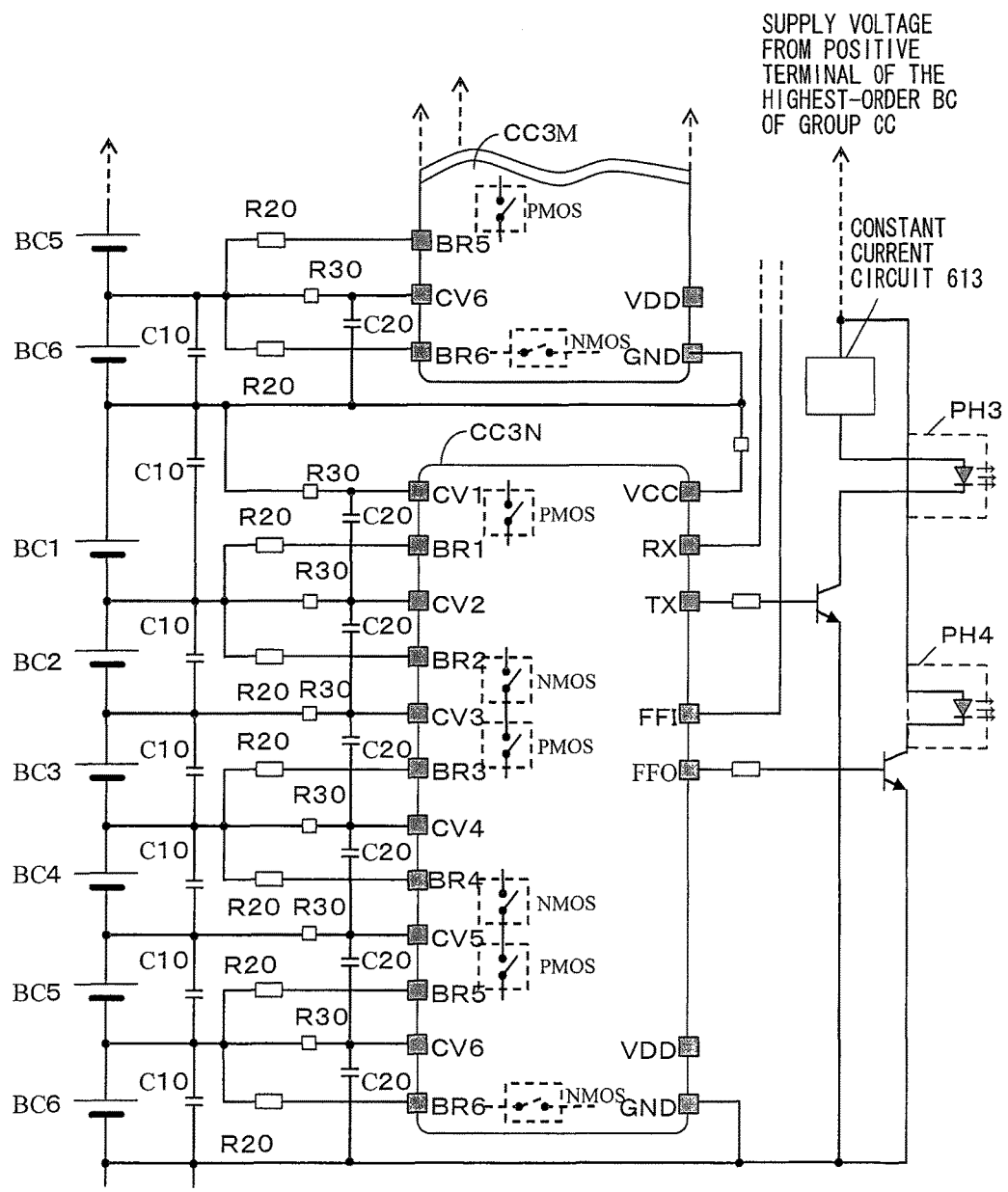
FIG. 9 illustrates connections between a battery cell controller CC3N and each battery cell of corresponding battery cell groups.

FIG. 9 illustrates connections between the battery cell controller CC3N and the battery cells of the battery cell group corresponding to the battery cell controller CC3N. While a filter circuit that reduces noise generated by the inverter 220 or the like and a discharge resistor that equalizes charged power amount in lithium ion battery cells are not figured in FIG. 1 and FIG. 6 for simplified descriptions, those are shown in detail in FIG. 9. It is to be noted that since the battery cell controllers other than the battery cell controller CC3N assume the same connection as that of the battery cell controller CC3N, the battery cell controller CC3N is now described as a representative example.

The battery cell controller CC3N includes voltage detection terminals CV1~CV6 and GND so as to detect the terminal voltages at the individual battery cells BC1~BC6 constituting the corresponding battery cell group. The terminals CV1~CV6 and the terminal GND are connected to the positive poles and the negative poles of the individual battery cells BC1~BC6. In addition, resistors R30 are provided on each input line of the terminals CV1~CV6. The battery cell controller CC3N is engaged in operation as the total voltage representing the difference between the highest potential and the lowest potential in the battery cell group corresponding to the battery cell controller CC3N is supplied thereto.

The battery cell controller CC3N includes circuits (a differential amplifier 262, an analog/digital converter 122A, and a data storage circuit 125 that are to be described later) related to voltage detection of the battery cells BC1~BC6 and a circuit via which over-charge diagnosis and over-discharge diagnosis are executed. Terminal voltages at the battery cells BC1~BC6 are input to the voltage detection circuit. Since the voltages are input to each terminal via the resistors R30, for instance, even if an abnormal short circuit occurs on a detection line through which the terminal voltages at the battery cells BC1~BC6 are led to the battery cell controller CC3N, short-circuit current is regulated to those circuits.

Significant noise is generated when the inverter 220 of FIG. 1 performs DC-AC power conversion. As described earlier, an automobile is likely to be used over a wide temperature range from low temperatures to high temperatures. Since the smoothing capacitor 228 in the inverter 220 deteriorates in terms of performance as a capacitor at low temperatures, performance will drastically deteriorate in the case where an electrolytic capacitor is used in comparison to the case where a film capacitor is used. As described above, significant noise is constantly applied to the battery cells BC1~BC6 not just when the capacitor performance deteriorates, therefore measures should be taken. In the present embodiment, as FIG. 9 shows, capacitors C10 and C20 and the resistors R30 are provided so as to have a removal effect upon the noise.

As described in FIG. 1, the circuit to drive the photocouplers PH3 and PH4 at the final end of the transmission path 60 is configured to be driven by the electric power supplied from the lowest potential terminal and the highest potential terminal of each of the battery cell controller groups CCG1 and CCG2. If the circuit is configured to operate, for example, by the voltage VCC at the battery cell controller CC3N disposed at the final end, when an abnormality attributable to a disconnection or the like has occurred on a voltage detection line at a battery cell controller CC3M, which lies next to the battery cell controller CC3N toward the higher potential-side, an unexpected high voltage may be applied to a photocoupler drive circuit. However, such a trouble can be avoided via the circuit driven by the electric power supplied from the lowest potential terminal and the highest potential terminal of the battery cell controller groups CCG1 and CCG2.

(Explanation of Battery Cell Controller)

Figure 10:
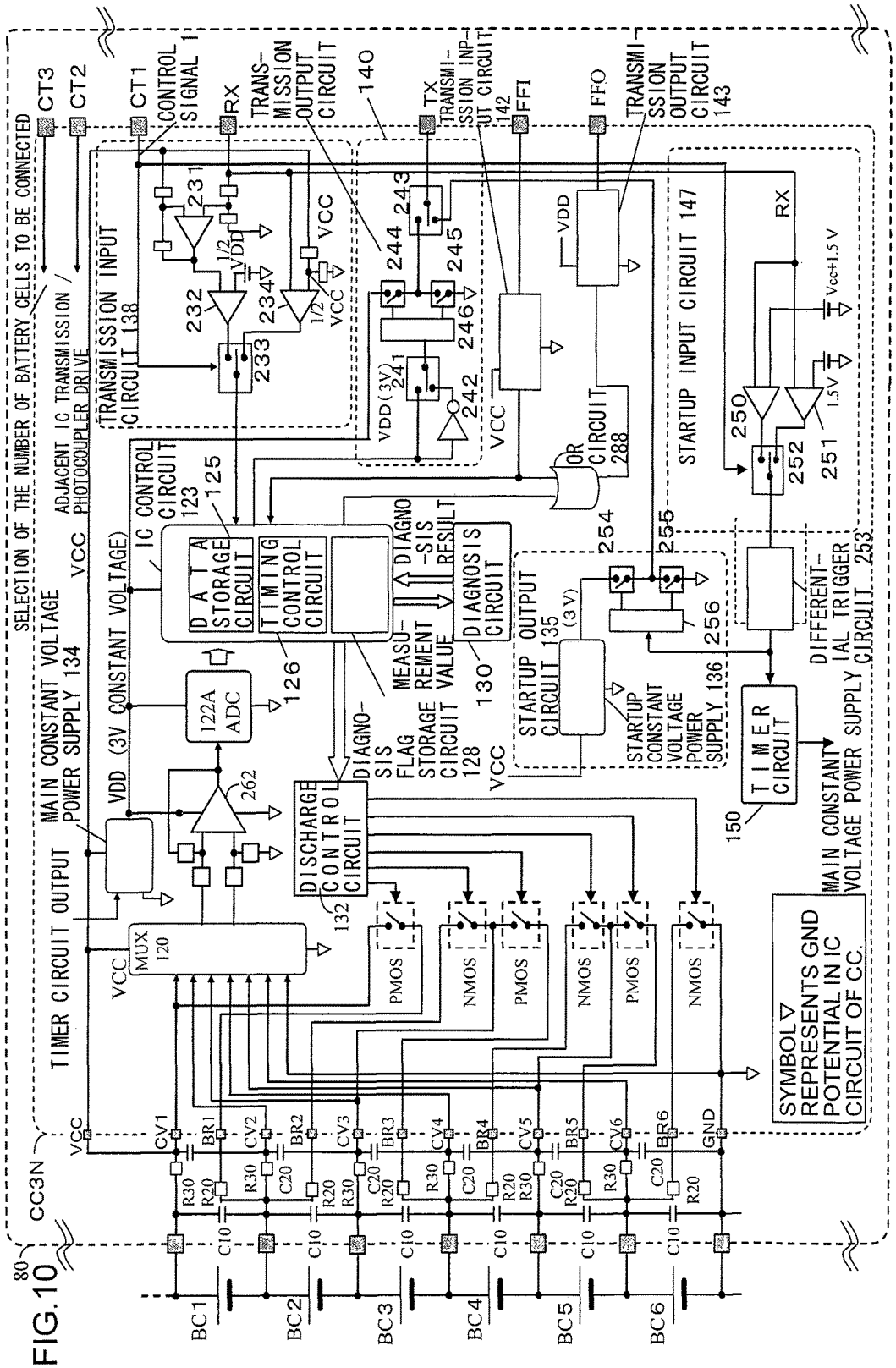
FIG. 10 is a diagram for explaining the internal structure of the battery cell controller CC3N.

FIG. 10 is a diagram explaining the internal structure of the battery cell controller CC3N, which is an integrated circuit. It is to be noted that since the other battery cell controllers assume the same structure as that of the battery cell controller CC3N, the battery cell controller CC3N is now described as a representative example. The terminal voltages at the lithium ion battery cells BC1~BC6 are input to a multiplexer 120 via the terminals CV1~CV6. The multiplexer 120 selects the terminals CV1~CV6 individually and the terminal voltages are respectively input to the differential amplifier 262 therethrough. The outputs from the differential amplifier 262 are converted into digital values by the analog/digital converter 122A, and the digitized terminal voltages are then provided to an IC control circuit 123 where they are held in the internal data storage circuit 125. These voltage values are used in the diagnosis and the like and are also transmitted to the battery controller 20 shown in FIG. 1. The terminal voltages at the lithium ion battery cells input at the terminals CV1~CV6 are biased at a potential based upon the terminal voltages at the lithium ion battery cells connected in series with regard to the ground potential of the battery cell controller, which is an integrated circuit. Influence of the bias potential is eliminated by the differential amplifier 262, and analog values based upon the terminal voltages at the lithium ion battery cells are input to the analog/digital converter 122A.

The IC control circuit 123, equipped with an arithmetic operation function, includes the data storage circuit 125, a timing control circuit 126 that cyclically detects various voltages and executes a state diagnosis, and a diagnosis flag storage circuit 128 in which a diagnosis flag from a diagnosis circuit 130 is set. Based upon measurement values from the IC control circuit 123, the diagnosis circuit 130 executes a variety of diagnoses such as over-charge diagnosis and over-discharge diagnosis. In the data storage circuit 125, which may be constituted with, for instance, a register circuit, the detected terminal voltages at the battery cells BC1~BC6 are stored in correspondence to the individual battery cells BC1~BC6. In addition, other detection values are held in the storage circuit 125 at predetermined addresses so that they can be read out as necessary.

The battery cell controllers, for which the battery cell controller CC3N is representatively explained, are each provided with balancing semiconductor switches (NMOS and PMOS) to adjust the charge amount (also referred to as the state of charge) of the lithium ion battery cells BC1~BC6 constituting the corresponding lithium ion battery cell group. For example, a PMOS switch is provided between the terminal CV1 and a terminal BR1 so as to adjust the charge amount of the lithium ion battery cell BC1. In the same manner, an NMOS switch is provided between a terminal BR2 and the terminal CV3 so as to adjust the charge amount of the lithium ion battery cell BC2; a PMOS switch is provided between the terminal CV3 and a terminal BR3 so as to adjust the charge amount of the lithium ion battery cell BC3; an NMOS switch is provided between a terminal BR4 and the terminal CV5 so as to adjust the charge amount of the lithium ion battery cell BC4; a PMOS switch is provided between the terminal CV5 and a terminal BR5 so as to adjust the charge amount of the lithium ion battery cell BC5; and an NMOS switch is provided between a terminal BR6 and the terminal GND so as to adjust the charge amount of the lithium ion battery cell BC6.

A discharge control circuit 132 executes open/close control of the balancing semiconductor switches. A command signal for setting the balancing semiconductor switch, corresponding to the battery cell to be discharged, in a continuous state is transmitted from the IC control circuit 123 to the discharge control circuit 132. The IC control circuit 123, upon receiving through communication a discharge time command indicating the discharge time corresponding to each of the battery cells BC1~BC6 from the battery controller 20 in FIG. 1, executes the discharge operation described above.

The battery modules 9A and 9B are charged with an electrical current supplied from the electrical load to all the battery cells connected in series. If the serially connected battery cells assume varying states of charge, the current supplied to the electrical load is regulated in correspondence to the state of the battery cell at the most advanced stage of discharge among the battery cells. The current supplied from the electrical load, on the other hand, is regulated in correspondence to the state of the battery cell at the most advanced stage of charge among the battery cells.

Therefore, for instance, the balancing semiconductor switches connected to the battery cells assuming state of charges exceeding the average state among the numerous serially connected battery cells are set in a continuous state so as to supply discharge current via the serially connected registers R30 and R20. As a result, the states of charge of the plurality of serially connected battery cells are controlled toward equalization. An alternative method whereby the battery cell in the most advanced stage of discharge is assigned as a reference cell and the discharge time for a given battery cell is determined based upon the difference relative to the state of charge of the reference cell may be adopted. There are various other methods that may be adopted for state of charge adjustment. The state of charge of each battery cell can be determined through arithmetic operation executed based upon the terminal voltage at the battery cell. There is a correlation between the state of charge of the battery cell and the terminal voltage at the battery cell and, accordingly, by controlling the balancing semiconductor switches so as to equalize the terminal voltages at the battery cells, the states of charge of the battery cells can be substantially equalized.

(Source Voltage VCC and Source Voltage VDD)

At least two types of source voltages VCC and VDD (3V) are used for the internal circuits of the battery cell controller CC3N. In the example shown in FIG. 10, the voltage VCC is the total voltage of the battery cell group constituted with the serially connected battery cells BC1~BC6. The voltage VDD is generated by the main constant voltage power supply 134 and a startup constant voltage power supply 136 of a startup output circuit 135. The multiplexer 120 and the transmission input circuits 138 and 142 for signal transmission operate at the high voltage VCC. On the other hand, the analog/digital converter 122A, the IC control circuit 123, the diagnosis circuit 130, and the transmission output circuits 140 and 143 for signal transmission operate at the low voltage VDD (3V).

The following operations and advantageous effects can be achieved by using the two types of source voltages VCC and VDD.

(a) The analog/digital converter 122A, the IC control circuit 123, the diagnosis circuit 130, and the transmission output circuits 140 and 143 are driven by the power source with low voltage VDD so as to reduce the voltage tolerance required to those circuits, thereby improving reliability and reducing the cost. In addition, a precise voltage can be supplied to the analog/digital converter 122A, thereby improving the measurement accuracy.

(b) By reducing the source voltage, power consumption at the battery cell controllers can be reduced, thereby reducing power consumption at the battery modules 9A and 9B.

(c) The transmission input circuits 138 and 142 for signal transmission are driven by the high voltage power source (VCC) and the transmission output circuits 140 and 143 for signal transmission are driven by the low voltage VDD so as to cause the serial connection (daisy chain connection) of the battery cell controllers CC3A~CC3N to have the following advantages. Namely, driving the transmission output circuits 140 and 143 by the low voltage VDD reduces the crest value of the signal to be input to the destination battery cell controller, thereby reducing the voltage tolerance of the destination battery cell controller. In addition, even in the case where the voltage tolerance of the destination battery cell controller is not reduced, voltage tolerance margin is increased, thereby improving reliability.

(d) The transmission input circuits 138 and 142 are driven by the high voltage source (VCC) and the transmission output circuits 140 and 143 are driven by the low voltage VDD, in other words, the transmission input circuits and the transmission output circuits are driven by different voltages from each other, thereby improving the stability of operation.

(Explanation of Signal Waveform)

Figure 11:
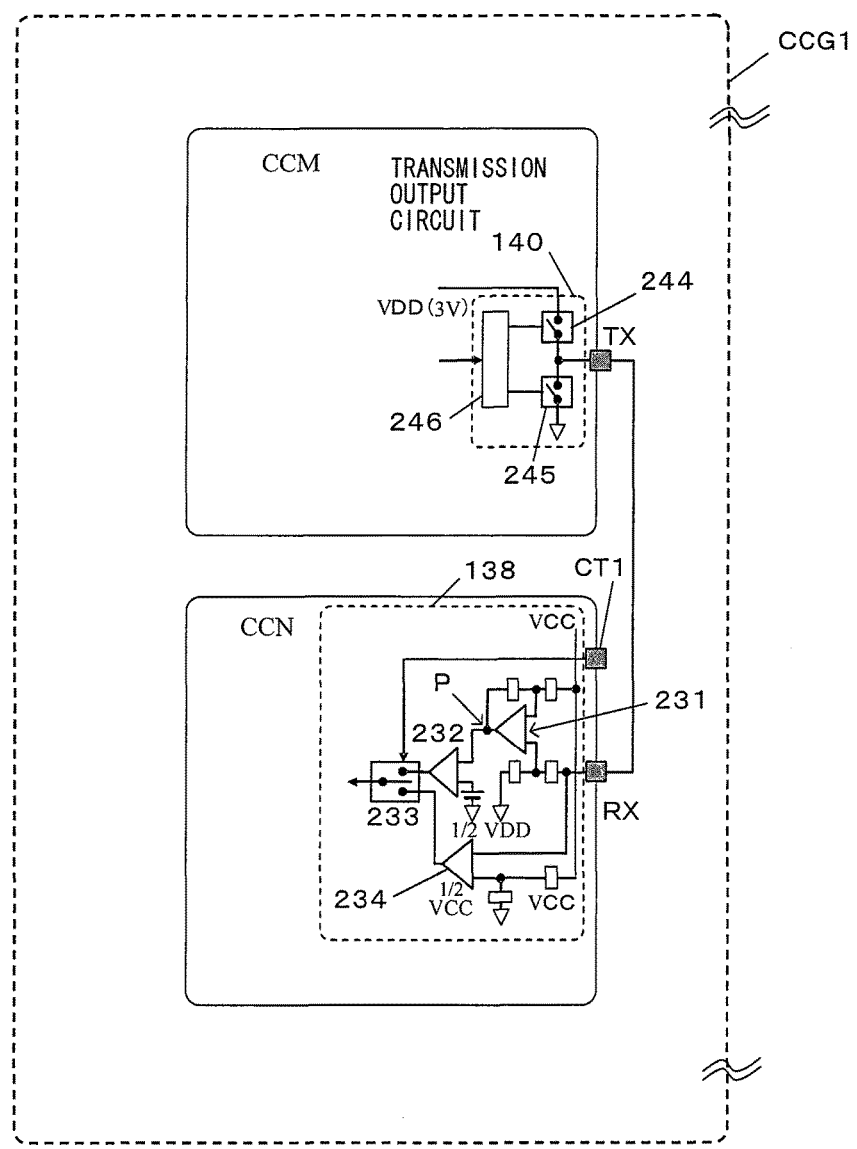
FIG. 11 is a diagram showing a transmission output circuit 140 of a battery cell controller CCM on the transmission side and a transmission input circuit 138 of a battery cell controller CCN on the reception side.
Figure 12:
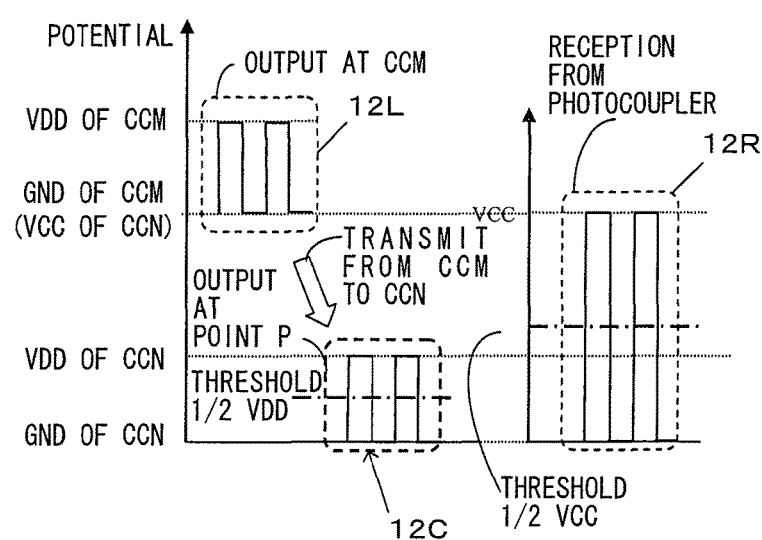
FIG. 12 shows a signal waveform.

FIGS. 11 and 12 show the relationship between drive voltage of the transmission output circuit 140 and the crest value of the signal destination. FIG. 11 shows the transmission output circuit 140 of the battery cell controller CCM on the transmission side and the transmission input circuit 138 of the battery cell controller CCN on the reception side. It is to be noted that the illustration of the transmission output circuit 140 is based upon that shown in FIG. 10 but some parts are not illustrated in FIG. 11. FIG. 12 shows the signal waveform.

As shown in FIG. 11, open/close of switches 244 and 245 is controlled by a control circuit 246 so that the transmission output circuit 140 outputs from the transmission terminal TX a signal having a waveform shown in the upper left of FIG. 12. As shown in FIG. 1, the terminal GND of the higher-order battery cell controller in the direction of transmission is connected to the terminal VCC of the lower-order battery cell controller in the direction of transmission. Accordingly, the transmission output circuit 140 outputs a signal with an amplitude of the voltage VDD in reference to the ground of the battery cell controller CCM, i.e., the VCC of the battery cell controller CCN. When the switch 245 is opened and the switch 244 is closed, a high level signal (potential VCC+VDD) is output. On the other hand, when the switch 245 is closed and the switch 244 is opened, a low level signal (potential VCC) is output (see the waveform of 12L in the left of FIG. 12).

A signal output from the transmission terminal TX of the battery cell controller CCM is input to the reception terminal RX of the lower-order battery cell controller CCN in the direction of transmission, and then input to a differential amplifier 231 of the transmission input circuit 138. The differential amplifier 231 outputs a signal corresponding to the difference between the signal from the battery cell controller CCM which has been input and the voltage VCC at the battery cell controller CCN. The signal of 12C shown in the middle of FIG. 12 is an output signal from the differential amplifier 231 (the signal at the point P in FIG. 11), with the low level of the signal being the potential at the ground level of the battery cell controller and the high level of the signal being the potential at the ground level+VDD. The signal output from the differential amplifier 231 is compared with a threshold value VDD/2 in a comparator 232, and is made a 1/0 signal.

The battery cell controllers each include a circuit 231 that receives a signal from the adjacent battery cell controller and a circuit 234 that receives a signal from the photocoupler. Which one of the circuits to use is selected by a selector 233 based upon the control signal applied to a terminal CT1 shown in FIG. 10. In the case where the battery cell controller CCN is the highest-order cell controller of the battery cell controller group CCG1 in the direction of transmission, i.e., in the case where a signal from the photocoupler PH1 is input to the reception terminal RX of the battery cell controller CCN, the lower contact of the selector 233 is closed and an output signal of a comparator 234 is output from the transmission input circuit 138. On the other hand, in the case where a signal from the adjacent battery cell controller is input to the reception terminal RX of the battery cell controller CCN, the upper contact of the selector 233 is closed and an output signal of the comparator 232 is output from the transmission input circuit 138. For the battery cell controller CCN shown in FIG. 11, a signal from the adjacent battery cell controller CCM is input to the transmission input circuit 138, therefore the upper contact of the selector 233 is closed.

In the case where the battery cell controller CCN is the highest-order battery cell controller, a signal shown as 12R in the right of FIG. 12 is input from the photocoupler PH1 to the reception terminal RX. In this case, the high level of the input signal is the potential VCC in reference to the ground level of the battery cell controller. The comparator 234 compares the signal from the photocoupler PH1, which has been input to the reception terminal RX, with the threshold value VCC/2, and outputs a 1/0 signal.

It is to be noted that since the transmission input circuit 142 and the transmission output circuit 143 shown in FIG. 10 assume the same circuit structures as those of the transmission input circuit 138 and the transmission output circuit 140 described above, and signal transmission between the terminal FFI and the terminal FFOUT is the same as that described above, explanations on them are not included herein.

(Control Terminals CT1~CT3)

The battery cell controller CC3N shown in FIG. 10 includes control terminals CT2 and CT3 to switch operations in addition to the control terminal CT1. As mentioned above, the control terminal CT1 is a terminal through which whether a transmission signal is received from the photocouplers PH1 and PH2 or from the adjacent battery cell controller is selected. Since output from the photocouplers and output from the terminals TX and FFO of the adjacent battery cell controller are different from each other in crest value of output waveforms, threshold values to be determined are different from each other. Accordingly, based upon a control signal input through the control terminal CT1, the selector 233 of the transmission input circuit 138 and a selector 252 of the startup input circuit 147 are switched. The selector 233 is switched in the manner described above, while the selector 252 is switched in the manner described below.

The control terminal CT2 is a control terminal through which whether a signal is transmitted to the adjacent battery cell controller or to the photocoupler is selected when the signal is output from the transmission terminals TX and FFOUT. The relationship (polarity) is different in signal waveform [H/L] corresponding to the signal [1]/[0] between transmission to the adjacent battery cell controller and that to the photocoupler. Description on this will be described in detail later.

The control terminal CT3 is a control terminal through which the number of cells, for instance six cells or four cells, constituting the battery cell group associated with the battery cell controller CC3N is selected. In accordance with the selected number of cells, the control for terminal voltage measurement and the like is optimized. As a result, a combination use of four-cell battery cell groups and six-cell battery cell groups easily enables the battery modules 9A and 9B with the variety of number of cells.

Figure 13:
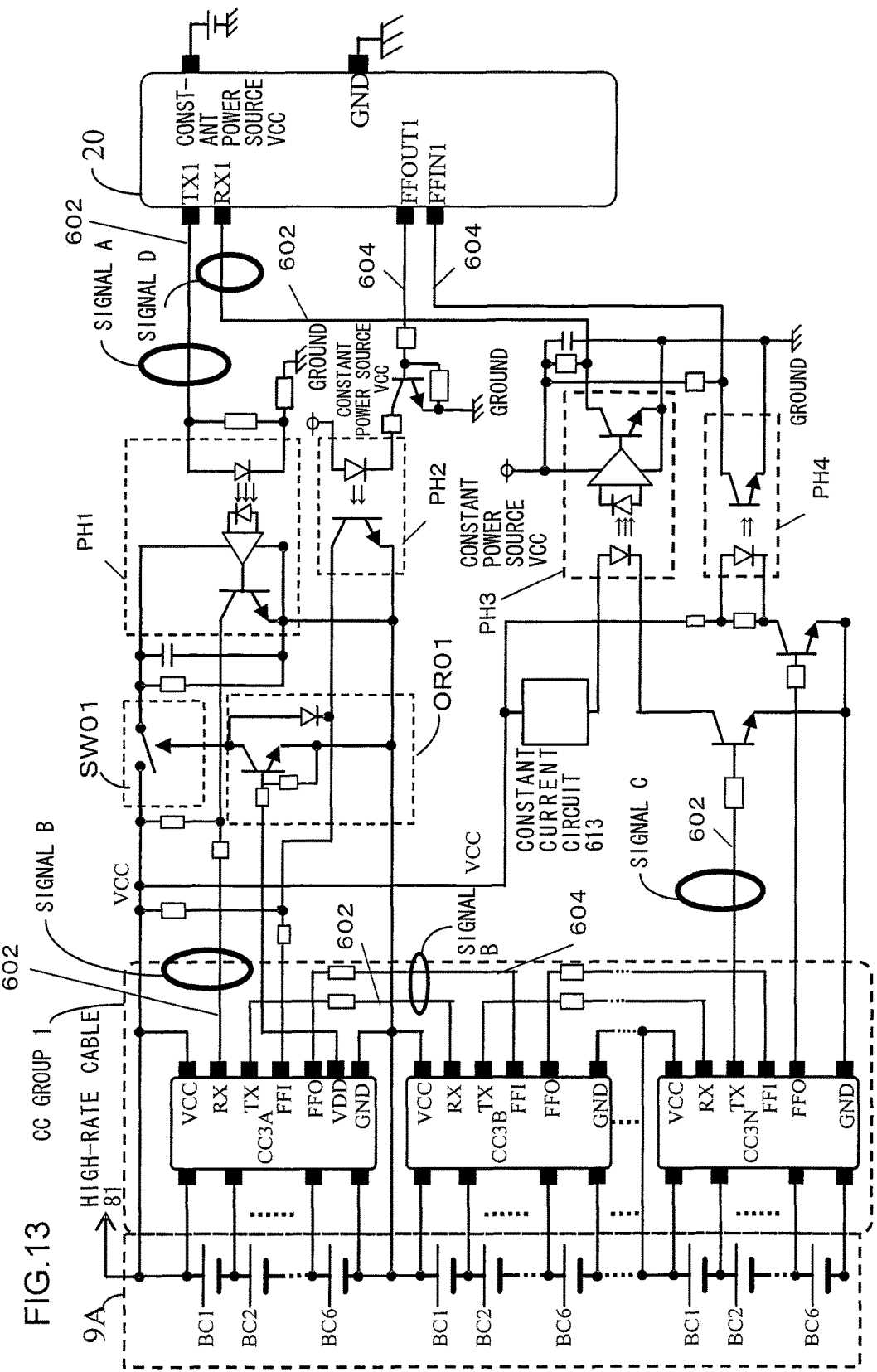
FIG. 13 is a diagram for explaining a function of a control terminal TC2.
Figure 14:
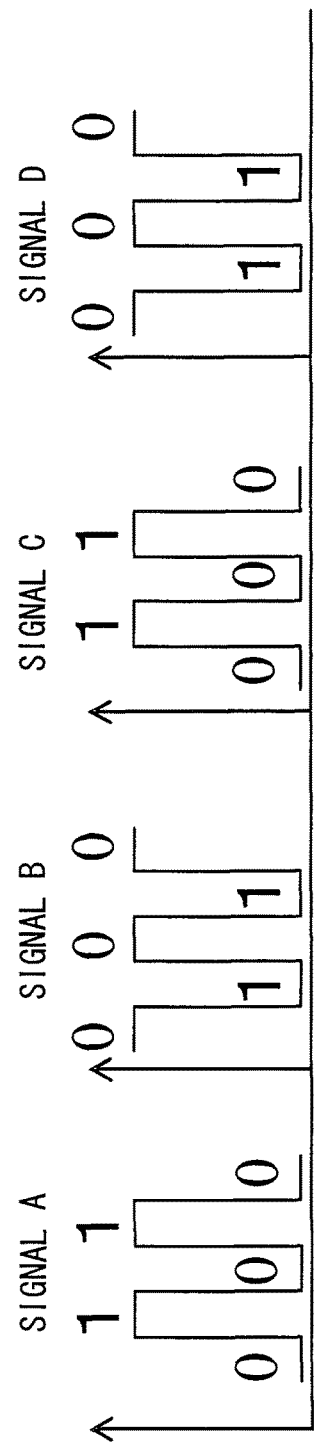
FIG. 14 shows waveforms of signals A D presented in FIG. 13.

FIGS. 13 and 14 are diagrams for explaining a function of the control terminal CT2. As described above, the control terminal CT2 is a control terminal through which whether a signal is transmitted to the adjacent battery cell controller or to the photocouplers PH3 and PH4 is selected, and a control signal indicating the destination is input thereto. Based upon the control signal input through the control terminal CT2, a selector 241 in the transmission output circuits 140 and 143 switches inversion or non-inversion of the transmission signal. As described later, when the destination is the photocouplers PH2 and PH4 shown in FIG. 1, the transmission signal is inverted so as to reduce power consumption at the photocouplers PH2 and PH4. It is to be noted that the basic operations executed in both systems, the transmission system between the terminal RX1 and the terminal TX1 and the transmission system between the terminal FFOUT1 and the terminal FFIN1, and their effects are the same. Now, the RX1-TX1 transmission system will be described below as a representative example.

A signal A in the transmission path 602 shown in FIG. 13 is an output from the battery controller 20, which is a higher-order control device, where, as shown in FIG. 14, the signal corresponding to [1] is at high level, and no signal or the signal corresponding to [0] is at low level. Accordingly, when no signal exists, the output from the transmission terminal TX1 of the battery controller 20 does not drive the photocoupler PH1, thereby reducing power consumption at the photocoupler PH1. In addition, not driving the photocoupler PH1 results in not driving the light-receiving circuit, which is in the cut off state through which no current flows, thereby contributing to reduction in power consumption.

In the cut off state, the reception terminal RX of the battery cell controller CC3A is at the high level. Accordingly, for a signal B in the transmission path 602 of the reception terminal RX, as shown in FIG. 14, the signal corresponding to [0] is at high level while the signal corresponding to [1] is at low level. Based upon the relationship, process of the battery cell controller CC3A is executed and a signal is transmitted to the next battery cell controller CC3B. Subsequently, based upon the relationship, the signal is transmitted in sequence to the battery cell controllers connected in series.

In the case where the output from the battery cell controller CC3N (output from the transmission terminal TX), which drives the photocoupler PH3, is in the above described relationship, in other words, in the case where a signal is output with [0] being at high level and [1] being at low level, the output level (output voltage) is at high level not only in a period during which the signal is in [0] state but also in a period during which no transmission signal is being output. Therefore, the photocouplers PH3 and PH4 on the output side are driven also while no transmission signal is being output, resulting in wasteful power consumption.

In the present embodiment, as shown in FIG. 10, the transmission output circuits 140 and 143 are each provided with the selector 241 and an inverter 242. The switching operation of the selector 241 is performed based upon a control signal input through the control terminal CT2. When a transmission signal is transmitted to the photocouplers PH3 and PH4, the signal is output after being inverted by the inverter 242. When a transmission signal is transmitted to the adjacent battery cell controller, the signal is output after not being inverted. Outputting a transmission signal from the transmission terminal TX and FFO after being inverted causes the waveform of a signal C in the transmission path 602 connected to the transmission terminal TX in the battery cell controller CC3N shown in FIG. 13 to appear as shown in FIG. 14. The signal C is inverted into the low level (low voltage) state in a period during which a signal [0] or no transmission signal is being output, where the photocouplers PH3 and PH4 are not driven. As a result, power consumption of the photocoupler can be reduced to substantial zero in this state. In addition, since a semiconductor on the light-receiving side is also cut off, thereby reducing power consumption.

Since the output side of the photocouplers PH3 and PH4 is pulled up by the resistors, potential of the output side is at low level (ground level) when the photocouplers PH3 and PH4 are driven, on the other hand, it is at high level (VCC) when the drives of the photocouplers PH3 and PH4 are stopped. Accordingly, the waveform of a signal D in the transmission path through which the photocoupler PH3 and the reception terminal RX of the battery controller 20 are connected appears as shown in FIG. 14.

Figure 15:
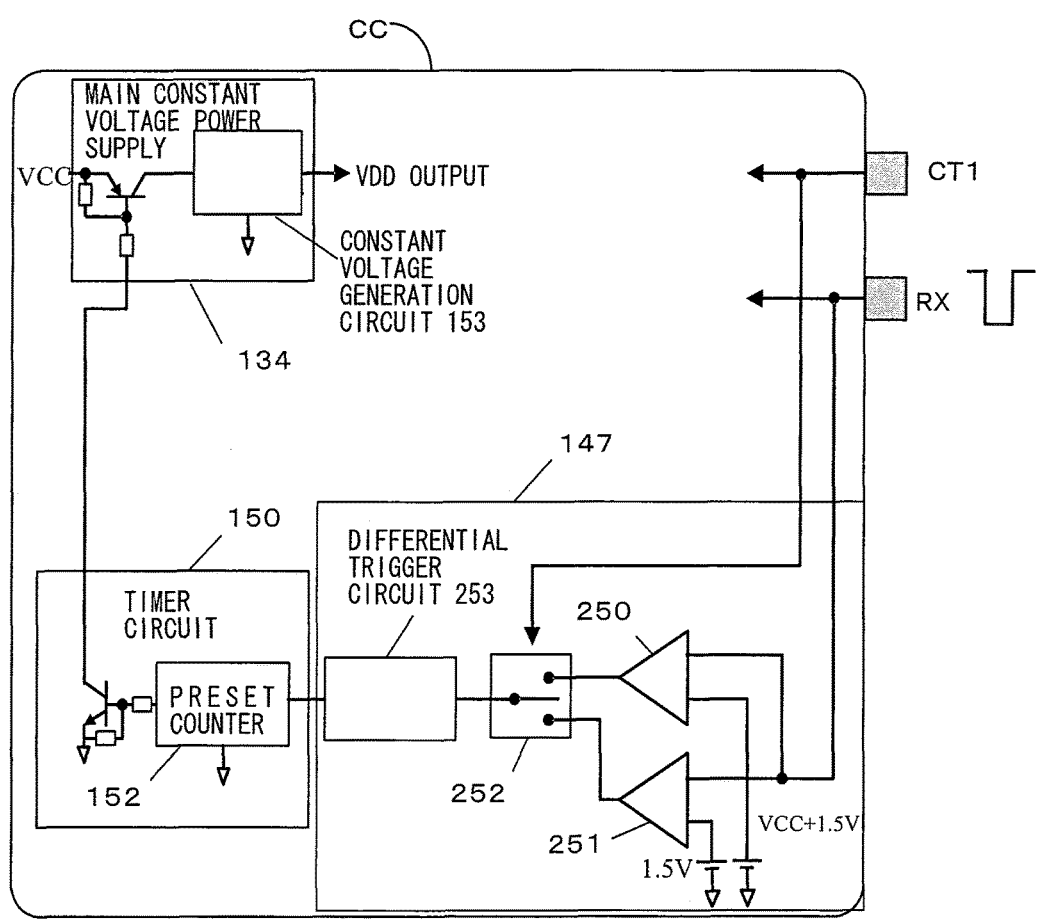
FIG. 15 is a diagram showing a startup input circuit 147, a timer circuit 150, and a main constant voltage power supply 134.
Figure 16:
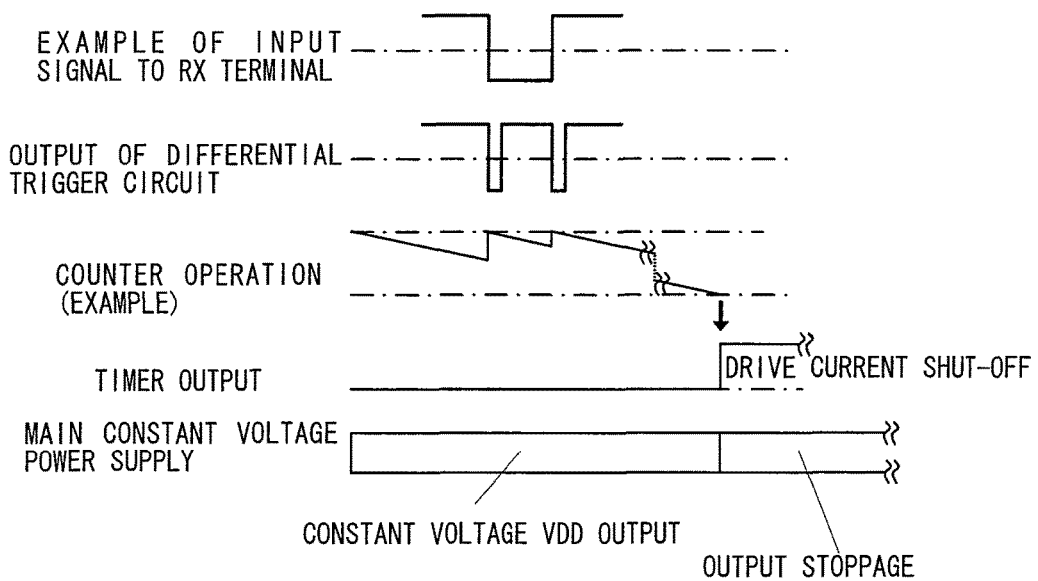
FIG. 16 is a diagram showing a signal that is input at a reception terminal RX of FIG. 15, an output of a differential trigger circuit 253, a counter operation, an output of the timer circuit 150, and an operating state of the main constant voltage power supply 134.

In FIG. 10, when the constant voltage VDD (3V) is output from the main constant voltage power supply 134, the battery cell controller CC3N shifts from a sleep state into an operating state. FIGS. 15 and 16 are diagrams showing stop and start of operation of the main constant voltage power supply 134, wherein FIG. 15 shows the startup input circuit 147, the timer circuit 150, and the main constant voltage power supply 134, while FIG. 16 shows signals to be output from each of the circuits shown in FIG. 15. When the startup input circuit 147 receives a signal having been transmitted from the adjacent battery cell controller or the photocoupler, the timer circuit 150 operates to supply the voltage VCC to the main constant voltage power supply 134. This operation causes the main constant voltage power supply 134 to enter the operating state, in which the constant voltage VDD is output from a constant voltage generation circuit 153.

The signals received at the reception terminal RX each have high and low levels (potential levels) whose change is captured by the differential trigger circuit 253, which includes, for example, a capacitor, and a trigger signal is transmitted to the timer circuit 150. If no trigger signal is input to the timer circuit 150 for a predetermined period of time, for instance, for a period of ten seconds, it stops drive output and stops the operation of the main constant voltage power supply 134. The timer circuit 150, which is constituted with, for instance, a preset-type down counter 152, is achieved by a circuit in which a counter value is set whenever a trigger signal is input. As shown in FIG. 16, when the counter value is set to a predetermined value (for example, zero) by countdown, the timer circuit 150 stops signal output and cuts off the VCC voltage supplied to the constant voltage generation circuit 153.

On the other hand, in FIG. 1, when a startup signal is output from the transmission terminal FFOUT of the battery controller 20, which is a higher-order control device, the switch SW01 is set in a continuous state and power is supplied to the photocoupler PH1, through which the TX signal is transmitted. As a result, the signal is transmitted to the reception terminal RX of the highest-order battery cell controller CC3A, and is input to the startup input circuit 147 through the reception terminal RX. The startup input circuit 147 is provided with the selector 252. In the battery cell controller connected so as to receive a signal from the photocoupler PH1, the lower contact of the selector 252 is always closed due to a signal applied to the control terminal CT1. In the battery cell controller like this, a signal having been input is compared with the threshold value (VCC+ 1.5V) by a comparator 250. On the other hand, in the battery cell controller that receives a signal from the adjacent battery cell controller, the upper contact of the selector 252 is always closed due to a signal applied to the control terminal CT1, a signal having been input is compared with the threshold value (1.5V) by a comparator 251.

The startup input circuit 147 outputs a [0]/[1] signal based upon the comparison result to the timer circuit 150 and the startup output circuit 135 via the differential trigger circuit 253. The startup output circuit 135 includes switches 254 and 255, which are connected to the startup constant voltage power supply 136 with the output voltage of 3V, and a control circuit 256, which controls open/close of those switches, converts a signal from the startup input circuit 147 into a signal with an amplitude of 3V, and transmits it to a selector 243 of the transmission output circuit 140. The selector 243 performs switching depending upon before/ after startup of the battery cell controller, and the lower contact thereof is closed before startup. Accordingly, a signal from the startup output circuit 135 is transmitted through the transmission terminal TX to the reception terminal RX of the next battery cell controller.

Thus, a signal is transmitted from the startup output circuit 135 to the reception terminal RX of the next battery cell controller independently of the startup operation of the battery cell controller that has received a signal through the reception terminal RX. This results in a faster startup operation of the whole system compared to the method in which a signal is transmitted to the next battery cell controller after the battery cell controller starts up.

Although the embodiment described with reference to FIG. 1 and FIG. 6~FIG. 13 assumes circuits in which information is transmitted through a transmission path in a direction from high-potential side to low-potential side, circuits are not limited thereto. Although information transmission in a direction from high-potential side to low-potential side has various advantages as in the embodiment described with reference to FIG. 1 and FIG. 6~FIG. 13, the effects can be achieved by information transmission in the opposite direction. An embodiment assuming information transmission in a direction from low-potential side to high-potential side is now be described with reference to FIGS. 17 to 20. However, the basic operation and advantageous effects achieved in common will not be described because they are the same as those in the embodiment described with reference to FIG. 1 and FIG. 6~FIG. 13. In addition, the transmission path formed by connecting the terminal RX and the terminal TX is described as a representative thereof because operations in regard to the relationship between potential change in battery cell controllers and the transmission direction are almost the same between the transmission path formed by connecting the terminal RX and the terminal TX and the transmission path formed by connecting the terminal FFI and the terminal FFO.

(Explanation of Another Embodiment of Transmission Circuit and Waveform)

Figure 17:
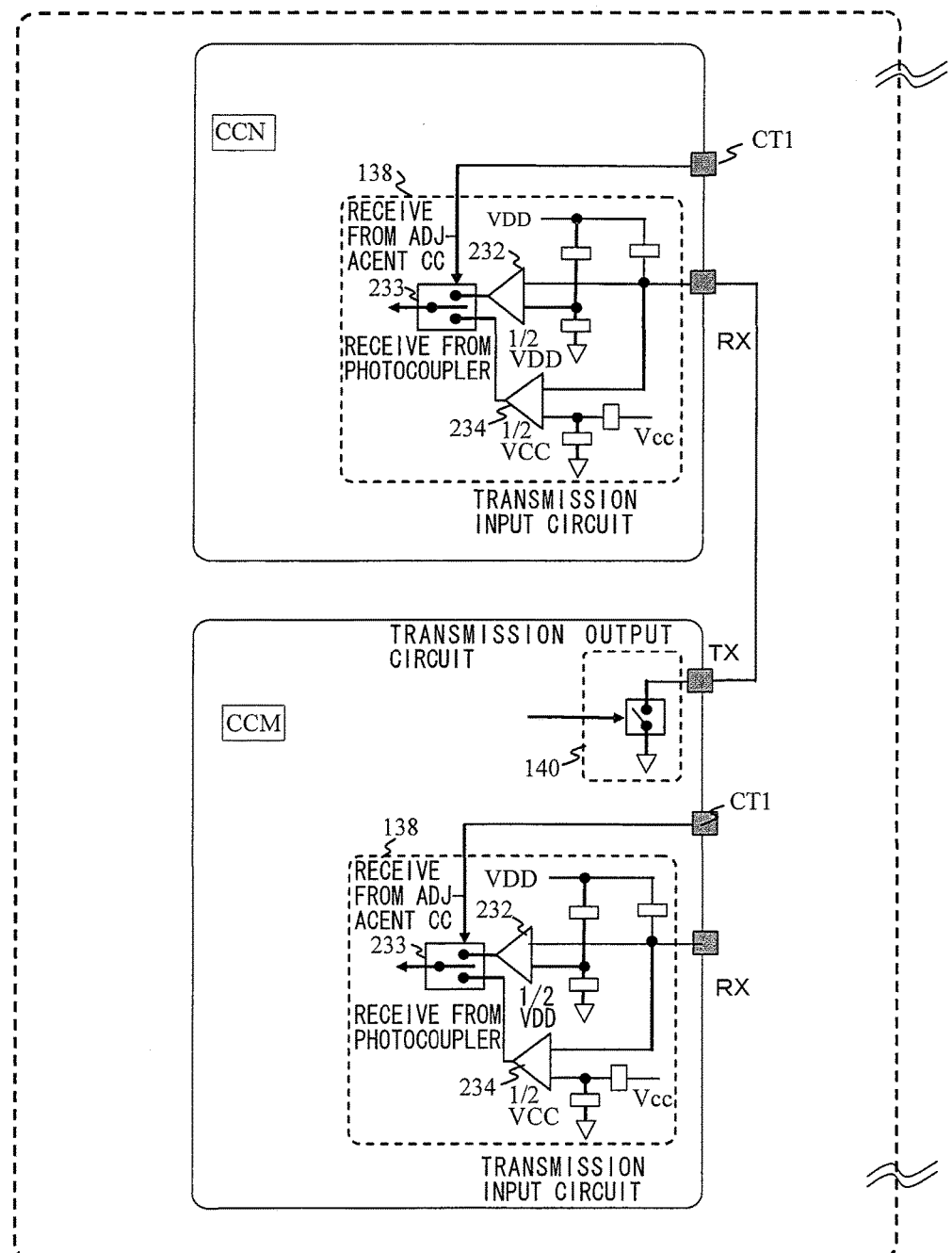
FIG. 17 is a diagram showing the transmission output circuit 140 of the battery cell controller CCM on the transmission side and the transmission input circuit 138 of the battery cell controller CCN on the reception side.
Figure 18:
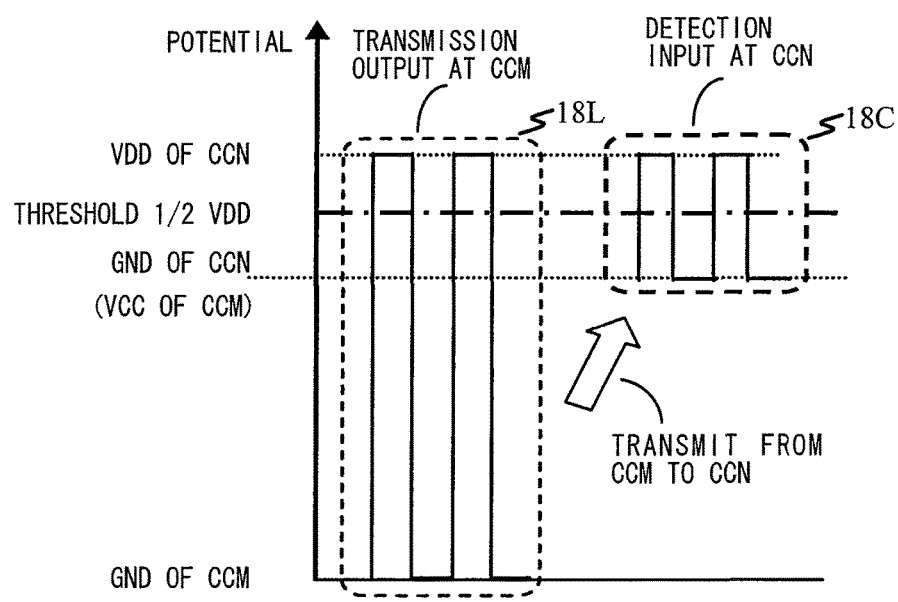
FIG. 18 shows a signal waveform of information to be transmitted.
Figure 19:
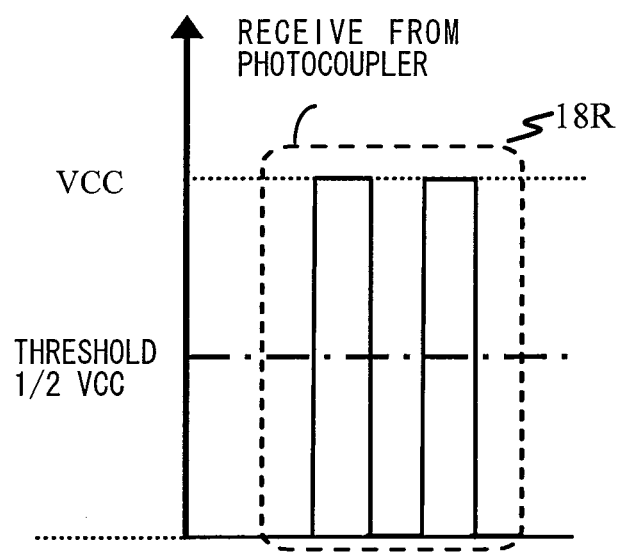
FIG. 19 shows a signal waveform of information to be transmitted.

FIGS. 17 to 19 show the relationship between drive voltage of the transmission output circuit 140 and the crest value of the signal destination. These present another embodiment of the invention shown in FIGS. 11 and 12. Unlike the embodiment presented in FIG. 1 and FIGS. 6 to 8, this embodiment assumes information transmission from the transmission terminal RX with low potential to the reception terminal TX with high potential. FIG. 17 shows the transmission output circuit 140 of the battery cell controller CCM on the transmission side and the transmission input circuit 138 of the battery cell controller CCN on the reception side. It is to be noted that the transmission output circuit 140 in FIG. 17 corresponds to the same shown in FIG. 11 described earlier, and that the illustration of the transmission output circuit 140 is based upon that presented in FIG. 10 but some parts are not illustrated in FIG. 17. FIG. 18 and FIG. 19 show signal waveforms of information to be transmitted.

Although the transmission output circuit 140 shown in FIG. 17 includes a circuit in which the control circuit 246 controls open/close of the switches 244 and 245 shown in FIG. 11, it is not illustrated in FIG. 17. The transmission output circuit 140 of the battery cell controller CCM outputs a signal having waveform shown in 18L of FIG. 18 through transmission terminal TX. In the present embodiment, the terminal VCC of higher-order battery cell controller CCM in the direction of transmission is connected to the terminal GND (ground) of the lower-order battery cell controller CCN in the direction of transmission. Accordingly, the transmission output circuit 140 outputs a signal with an amplitude of the voltage (VCC+VDD) in reference to the ground of the battery cell controller CCM.

A signal, having been output from the transmission terminal TX of the battery cell controller CCM, is input to the reception terminal RX of the lower-order battery cell controller CCN in the direction of transmission, and then input to the comparator 232 of the transmission input circuit 138. Since the comparator 232 has the ground level at the potential of VCC of the battery cell controller CCM and the threshold value of VDD/2 voltage in addition to the ground potential, the output signal from the battery cell controller CCM is compared with the voltage (VCC+VDD/2). This state is shown with a signal 18C of FIG. 18.

As described with reference to FIG. 11, the battery cell controllers in FIG. 17 each include the comparator 232 that receives a signal from another battery cell controller adjacent thereto and the comparator 234 that receives a signal from the photocoupler. The selection as to which one of those comparator circuits to be used is made by the selector 233, which operates based upon a control signal applied to the terminal CT1. In the case where the battery cell controller CCN is the highest-order cell controller of the battery cell controller group CCG1 in the direction of transmission, i.e., in the case where a signal from the photocoupler PH1 is input to the reception terminal RX of the battery cell controller CCM or CCN, the lower contact of the selector 233 is closed and an output signal of the comparator 234 is used as a transmission input signal.

In the case of the battery cell controller CCN of FIG. 17, since the reception terminal RX of the battery cell controller CCN is connected with the output terminal TX of the adjacent battery cell controller CCM, based upon a control signal received through the terminal CT1, the upper contact of the selector 233 is closed and an output signal of the comparator 232 is output as an output signal of the transmission input circuit 138.

FIG. 19 shows an operation of the battery cell controller receiving a signal from the photocoupler, which is an electric insulating circuit. When the battery cell controller receives a signal from the photocoupler, the selector 233 selects the comparator 234 based upon a control signal applied to the terminal CT1. As described earlier with reference to FIG. 12, the amplitude of the signal input from the photocoupler to the reception terminal RX changes at the voltage VCC in reference to the ground level of the battery cell controller. Accordingly, in the present embodiment, as in the one described with reference to FIG. 11, the threshold of the comparator 234, which compares signals from the photocoupler, is the voltage VCC/2, which is higher than the threshold of the comparator 232. The comparator 232 compares the input signal with the above threshold VCC/2 and outputs the result as a 1/0 signal, which is a digital value.

It is to be noted that since the transmission input circuit 138 and the transmission output circuit 140 shown in FIG. 17 are the same in the transmission path using the terminals FFO and FFI described below, explanations on them are not included herein.

(Explanation of Another Embodiment of Battery Cell Controllers)

Figure 20:
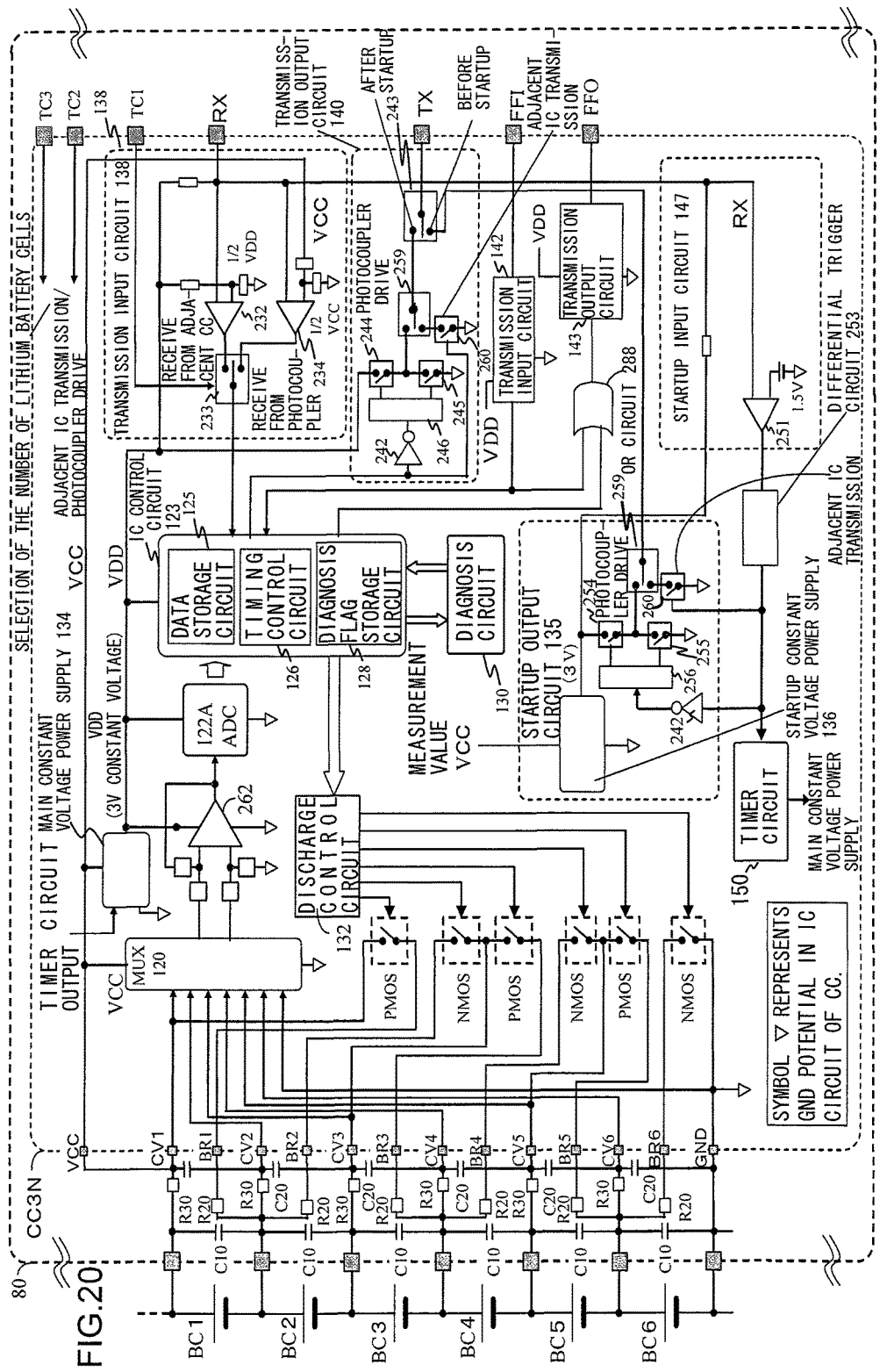
FIG. 20 is a diagram showing another embodiment for explaining the internal structure of battery cell controllers, which are integrated circuits.

FIG. 20 is a diagram showing another embodiment for explaining the internal structure of battery cell controllers, which are integrated circuits, described earlier with reference to FIG. 10. The difference between FIG. 20 and FIG. 10 lies in whether or not to include the circuits shown in FIG. 17. It is to be noted that although the other battery cell controllers assume the similar structures, the battery cell controller CC3N is now explained as a representative example.

As FIG. 10 shows, the terminal voltages at the lithium ion battery cells BC1~BC6 are input to the multiplexer 120 via the terminals CV1~CV6. The multiplexer 120 selects the terminals CV1~CV6 individually and the terminal voltages are respectively input to the differential amplifier 262 therethrough. The outputs from the differential amplifier 262 are converted into digital values by the analog/digital converter 122A, and the digitized terminal voltages are then provided to the IC control circuit 123 where they are held in the internal data storage circuit 125. These voltage values are used in the diagnosis and the like and are also transmitted to the battery controller 20 shown in FIG. 1.

Similarly to the explanation on FIG. 10, the IC control circuit 123, equipped with an arithmetic operation function, includes the data storage circuit 125, the timing control circuit 126 that cyclically detects various voltages and executes a state diagnosis, and the diagnosis flag storage circuit 128 in which the diagnosis flag from the diagnosis circuit 130 is set. Based upon measurement values from the IC control circuit 123, the diagnosis circuit 130 executes a variety of diagnoses such as over-charge diagnosis and over-discharge diagnosis. In the data storage circuit 125, which may be constituted with, for instance, a register circuit, the detected terminal voltages at the battery cells BC1~BC6 are stored in correspondence to the individual battery cells BC1~BC6. In addition, other detection values are held in the storage circuit 125 at predetermined addresses so that they can be read out as necessary.

As described earlier with reference to FIG. 10, the battery cell controllers are each provided with balancing semiconductor switches (NMOS and PMOS) to adjust the charge amount (also referred to as the state of charge) of the lithium ion battery cells BC1~BC6 constituting the corresponding lithium ion battery cell group. For example, a PMOS switch is provided between the terminal CV1 and a terminal BR1 so as to adjust the charge amount of the lithium ion battery cell BC1. In the same manner, an NMOS switch is provided between a terminal BR2 and the terminal CV3 so as to adjust the charge amount of the lithium ion battery cell BC2; a PMOS switch is provided between the terminal CV3 and a terminal BR3 so as to adjust the charge amount of the lithium ion battery cell BC3; an NMOS switch is provided between a terminal BR4 and the terminal CV5 so as to adjust the charge amount of the lithium ion battery cell BC4; a PMOS switch is provided between the terminal CV5 and a terminal BR5 so as to adjust the charge amount of the lithium ion battery cell BC5; and an NMOS switch is provided between a terminal BR6 and the terminal GND so as to adjust the charge amount of the lithium ion battery cell BC6.

The discharge control circuit 132 executes open/close control of the balancing semiconductor switches. A command signal for setting the balancing semiconductor switch, corresponding to the battery cell to be discharged, in a continuous state is transmitted from the IC control circuit 123 to the discharge control circuit 132. The IC control circuit 123, upon receiving through communication a discharge time command indicating the discharge time corresponding to each of the battery cells BC1~BC6 from the battery controller 20 in FIG. 1, executes the discharge operation described above.

As described earlier with reference to FIG. 10, at least two types of source voltages VCC and VDD (3V) are used for the internal circuits of the battery cell controller CC3N. The voltage VCC, which is higher than the voltage VDD, is the total voltage of the battery cell group constituted with the serially connected battery cells BC1~BC6 in the present embodiment. The voltage VDD is generated by the main constant voltage power supply 134 and the startup constant voltage power supply 136 of the startup output circuit 135. The multiplexer 120 operates at the high voltage VCC. On the other hand, the transmission output circuits 138 and 142 for signal transmission, the analog/digital converter 122A, the IC control circuit 123, the diagnosis circuit 130, and the transmission output circuits 140 and 143 for signal transmission operate at the low voltage VDD (3V).

The following operations and advantageous effects can be achieved by using the two types of source voltages VCC and VDD.

(a) The analog/digital converter 122A, the IC control circuit 123, the diagnosis circuit 130, and the transmission output circuits 140 and 143 are driven by the power source with low voltage VDD so as to reduce the voltage tolerance required to those circuits, thereby improving reliability and reducing the cost. In addition, a precise voltage can be supplied to the analog/digital converter 122A, thereby improving the measurement accuracy.

(b) By reducing the source voltage, power consumption at the battery cell controllers can be reduced, thereby reducing power consumption at the battery modules 9A and 9B.

(c) Driving the transmission input circuits 138 and 142 for signal transmission or the transmission output circuits 140 and 143 for signal transmission by the low voltage VDD reduces the crest value of the signal to be input to the destination battery cell controller, thereby reducing the voltage tolerance of the destination battery cell controller. In addition, even in the case where the voltage tolerance of the destination battery cell controller is not reduced, voltage tolerance margin is increased, thereby improving reliability.

The transmission output circuit 140 operates in a manner as described earlier with reference to FIG. 17 and, as shown in FIG. 20 in detail, includes a switch circuit 260 that produces a signal to be transmitted to the adjacent battery cell controller and the switch circuits 244 and 245 that produce a signal to be transmitted to the photocoupler. Selection as to which one of those signals to be used is made by a selector 259, which operates based upon a control signal applied to the terminal TC2. The inverter circuit 242, which is a circuit to invert a signal, has a function for the photodiode in the photocoupler not to be driven by the signal indicating "zero" of the signal value. This function reduces power consumption in the photocoupler. In particular, since transmission operation ceases when the vehicle is parked, drive current of the photodiode which does not flow while the signal value is "zero" results in a significant saving in power consumption. The control circuit 246, having a function to drive the switch circuits 244 and 245, operates the switch circuits 244 and 245 based upon output from the inverter circuit 242. The signal shown as 18L of FIG. 18 is output from the switch circuit 260. A signal 18R shown in FIG. 19 is output from the switch circuits 244 and 245.

The selector 243 performs switching depending upon before/after startup of the battery cell controller. After startup of the battery cell controller, the switch circuits 244 and 245 and the switch circuit 260 are selected and signals therefrom are output through the terminal TX. Since the transmission output circuit 143, which outputs a signal through the terminal FFO, has the same structure and effects as those of the transmission output circuit 140, explanation on it is are not included herein.

The transmission input circuit 138 is the same as that shown in FIG. 17. The transmission input circuit 142 related to an input signal from the terminal FFI is the same as the transmission input circuit 138, therefore explanation on it is not included herein. The signal received through the terminal FFI is used for transmitting an abnormal state. Upon receiving a signal indicating an abnormality through the terminal FFI, the signal is input to the transmission output circuit 143 through the transmission input circuit 142 and an OR circuit 288 and is output from the transmission output circuit 143 through the terminal FFO. When an abnormality is detected by the diagnosis circuit 130, regardless of the content received by the terminal FFI, a signal indicating an abnormality is input from the diagnosis flag storage circuit 128 to the transmission output circuit 143 through the OR circuit 288 and is output from the transmission output circuit 143 through the terminal FFO.

As explained with reference to FIG. 10, upon receiving a signal through the terminal RX, the comparator 251 of the startup input circuit 147 detects the reception of the signal, and a trigger signal is transmitted to the timer circuit 150 by the differential trigger circuit 253, as well as transmitted to the startup output circuit 135, from which a startup signal is output through the terminal TX via the selector 243. The battery cell controller starts up upon operation of the timer circuit 150 and subsequent operation of the main power supply circuit 134. However, since, before the startup, a startup signal is transmitted from the startup output circuit 135 to the next battery cell controller, the whole system starts up in a short period of time.

Similarly to the transmission output circuits 140 and 143, the startup output circuit of FIG. 20 can select either output to the photocoupler or output to the adjacent integrated circuit, and includes the inverter circuit 242 for reducing power consumption of the photocoupler. An output circuit to the photocoupler is not necessarily required as long as only the startup control of the battery cell controller, which is the adjacent integrated circuit, is executed. However, reliability is improved more if the higher-order control circuit 20 can ensure whether or not the startup signal has been transmitted correctly. For this reason, it is important for the startup output circuit to include the output circuit to the photocoupler.

The embodiments described above may be adopted by themselves or in combination. The advantages of the individual embodiments may be realized independently of one another or synergistically through combination thereof. In addition, the present invention may be embodied in any way other than those described in reference to the embodiments, as long as the features characterizing the present invention remain intact.

What is claimed is:

1. A battery system, comprising:
    a first lithium ion battery module that is constituted with a plurality of serially connected first lithium ion battery cell groups constituted with a plurality of serially connected lithium ion battery cells;
    a second lithium ion battery module that is constituted with a plurality of serially connected second lithium ion battery cell groups constituted with a plurality of serially connected lithium ion battery cells;
    a connector that removably connects the first lithium ion battery module with the second lithium ion battery module in series;
    one power supply line that is connected to one end of the first lithium ion battery module;

another power supply line that is connected to the other end of the second lithium ion battery module;
a plurality of first integrated circuits that are provided corresponding to each first lithium ion battery cell group constituting the first lithium ion battery module so as to perform processing on lithium ion battery cells of corresponding first lithium ion battery cell group; and
a plurality of second integrated circuits that are provided corresponding to each second lithium ion battery cell group constituting the second lithium ion battery module so as to perform processing on lithium ion battery cells of corresponding second lithium ion battery cell group, wherein:
the first and second integrated circuits each include transmission terminals for transmitting signals and reception terminals for receiving signals, and each further include a plurality of voltage detection terminals for receiving terminal voltage at each lithium ion battery cell constituting a corresponding lithium ion battery cell group;
a first transmission path is formed by electrically connecting transmission terminals of the plurality of first integrated circuits and reception terminals of adjacent first integrated circuits respectively;
a second transmission path is formed by electrically connecting transmission terminals of the plurality of second integrated circuits and reception terminals of adjacent second integrated circuits respectively, and
an insulating circuit is provided for performing information transmission between the reception terminal or the transmission terminal of the first integrated circuit provided corresponding to the first lithium ion battery cell group at the other end of the first lithium ion battery module and the reception terminal or the transmission terminal of the second integrated circuit provided corresponding to the second lithium ion battery cell group at the one end of the second lithium ion battery module, so as to perform information transmission between the first transmission path and the second transmission path via the insulating circuit.

2. A battery system, comprising:
a first lithium ion battery module that is constituted with a plurality of serially connected first lithium ion battery cell groups constituted with a plurality of serially connected lithium ion battery cells;
a second lithium ion battery module that is constituted with a plurality of serially connected second lithium ion battery cell groups constituted with a plurality of serially connected lithium ion battery cells;
one power supply line that is connected to one end of the first lithium ion battery module;
another power supply line that is connected to the other end of the second lithium ion battery module;
a connector that removably connects the first lithium ion battery module with the second lithium ion battery module in series;
a plurality of first integrated circuits that are provided corresponding to each first lithium ion battery cell group constituting the first lithium ion battery module so as to perform processing on lithium ion battery cells of corresponding first lithium ion battery cell group;
a plurality of second integrated circuits that are provided corresponding to each second lithium ion battery cell group constituting the second lithium ion battery module so as to perform processing on lithium ion battery cells of corresponding second lithium ion battery cell group; and
a control circuit that controls the plurality of first and second integrated circuits, wherein:
a series circuit is formed by electrically connecting the one power supply line, the first lithium ion battery module, the connector, the second lithium ion battery module, and the other power supply line;
the control circuit, including transmission terminals for transmitting information and reception terminals for receiving information, operates based upon a power source electrically insulated from the series circuit;
each of the first and second integrated circuits includes transmission terminals for transmitting information, reception terminals for receiving information, and voltage detection terminals for receiving terminal voltage at each lithium ion battery cell constituting a corresponding lithium ion battery cell group, includes an analog/digital converter circuit therein, and converts terminal voltage at each lithium ion battery cell that has been input to the voltage detection terminal into a digital value and holds the same;
a first transmission path is formed by electrically connecting transmission terminals of the plurality of first integrated circuits and reception terminals of adjacent first integrated circuits;
a second transmission path is formed by electrically connecting transmission terminals of the plurality of second integrated circuits and reception terminals of adjacent second integrated circuits;
a first insulating circuit is provided for performing information transmission between the transmission terminals of the control circuit and the reception terminals of the first integrated circuit provided corresponding to the first lithium ion battery cell group at the one end of the first lithium ion battery module, so as to perform information transmission between the control circuit and the first transmission path via the first insulating circuit;
a second insulating circuit is provided for performing information transmission between the transmission terminals of the first integrated circuit provided corresponding to the first lithium ion battery cell group at the other end of the first lithium ion battery module and the reception terminals of the second integrated circuit provided corresponding to the second lithium ion battery cell group at the one end of the second lithium ion battery module, so as to perform information transmission between the first transmission path and the second transmission path via the second insulating circuit; and
a third insulating circuit is provided for performing information transmission between the transmission terminals of the second integrated circuit provided corresponding to the second lithium ion battery cell group at the other end of the second lithium ion battery module and the reception terminals of the control circuit, so as to perform information transmission between the second transmission path and the control circuit via the third insulating circuit.

3. A battery system, comprising:
a first battery module that is constituted with a plurality of serially connected battery cells;
a second battery module that is constituted with a plurality of serially connected battery cells;
a connector that removably connects the first battery module with the second battery module in series;
a plurality of first integrated circuits that group battery cells of the first battery module by a plurality thereof so as to perform processing on battery cells in each group;

a plurality of second integrated circuits that group battery cells of the second battery module by a plurality thereof so as to perform processing on battery cells in each group;

a first transmission path through which a command signal is transmitted via a first insulating circuit from a higher-order control circuit that controls the plurality of first and second integrated circuits to a highest-order first integrated circuit of the plurality of first integrated circuits;

a second transmission path through which a data signal collected by the plurality of first integrated circuits is transmitted from the highest-order first integrated circuit to a lowest-order first integrated circuit;

a third transmission path through which the data signal collected by the plurality of first integrated circuits is transmitted from the lowest-order first integrated circuit to a highest-order second integrated circuit of the plurality of second integrated circuits via a second insulating circuit;

a fourth transmission path through which the data signal collected by the plurality of first integrated circuits and a data signal collected by the plurality of second integrated circuits are transmitted from the highest-order second integrated circuit to a lowest-order second integrated circuit; and a fifth transmission path through which the data signals collected by the plurality of first and second integrated circuits are transmitted from the lowest-order second integrated circuit to the higher-order control circuit via a third insulating circuit that is driven with electric power by a total voltage at the second battery module.

* * * * *